US011520235B2

(12) United States Patent
Johnson

(10) Patent No.: US 11,520,235 B2
(45) Date of Patent: Dec. 6, 2022

(54) EUV LITHOGRAPHY SYSTEM WITH DIFFRACTION OPTICS

(71) Applicant: Kenneth Carlisle Johnson, Santa Clara, CA (US)

(72) Inventor: Kenneth Carlisle Johnson, Santa Clara, CA (US)

( * ) Notice: Subject to any disclaimer, the term of this patent is extended or adjusted under 35 U.S.C. 154(b) by 68 days.

(21) Appl. No.: 17/062,558

(22) Filed: Oct. 3, 2020

(65) Prior Publication Data

US 2022/0107568 A1    Apr. 7, 2022

Related U.S. Application Data

(60) Provisional application No. 62/931,323, filed on Nov. 6, 2019, provisional application No. 62/911,467, filed on Oct. 7, 2019.

(51) Int. Cl.
*G03F 7/20*         (2006.01)
*G02B 5/18*         (2006.01)
(Continued)

(52) U.S. Cl.
CPC ....... *G03F 7/70158* (2013.01); *G02B 5/1885* (2013.01); *G02B 17/0892* (2013.01);
(Continued)

(58) Field of Classification Search
CPC ............ G03F 7/70158; G03F 7/70283; G03F 7/70208; G03F 7/702; G03F 7/70033;
(Continued)

(56) References Cited

U.S. PATENT DOCUMENTS 7,050,237 B2    5/2006  Chapman
7,499,149 B2    3/2009  Hendriks et al.
(Continued)

OTHER PUBLICATIONS

Johnson, "Maskless EUV Lithography", conference presentation at the 2019 EUVL Workshop. https://www.euvlitho.com/2019/P22.pdf.
(Continued)

*Primary Examiner* — Mesfin T Asfaw

(57) ABSTRACT

A maskless, extreme ultraviolet (EUV) lithography scanner uses an array of microlenses, such as binary-optic, zone-plate lenses, to focus EUV radiation onto an array of focus spots (e.g. about 2 million spots), which are imaged through projection optics (e.g., two EUV mirrors) onto a writing surface (e.g., at 6× reduction, numerical aperture 0.55). The surface is scanned while the spots are modulated to form a high-resolution, digitally synthesized exposure image. The projection system includes a diffractive mirror, which operates in combination with the microlenses to achieve point imaging performance substantially free of geometric and chromatic aberration. Similarly, a holographic EUV lithography stepper can use a diffractive photomask in conjunction with a diffractive projection mirror to achieve substantially aberration-free, full-field imaging performance for high-throughput, mask-projection lithography. Maskless and holographic EUV lithography can both be implemented at the industry-standard 13.5-nm wavelength, and could potentially be adapted for operation at a 6.7-nm wavelength.

25 Claims, 19 Drawing Sheets

(51) Int. Cl.
*G02B 17/08* (2006.01)
*G02B 26/08* (2006.01)
*G02B 27/42* (2006.01)

(52) U.S. Cl.
CPC ..... *G02B 26/0808* (2013.01); *G02B 26/0816* (2013.01); *G02B 27/4222* (2013.01); *G03F 7/70283* (2013.01)

(58) Field of Classification Search
CPC ............. G03F 7/70275; G03F 7/70383; G02B 5/1885; G02B 17/0892; G02B 26/0808; G02B 26/0816; G02B 27/4222; G02B 3/0056
See application file for complete search history.

(56) References Cited

U.S. PATENT DOCUMENTS

| | | | |
|---|---|---|---|
| 9,097,983 B2 | 8/2015 | Johnson | |
| 2016/0161856 A1* | 6/2016 | Johnson | G03F 7/704 355/55 |
| 2019/0235141 A1* | 8/2019 | Naujok | G02B 5/0891 |

OTHER PUBLICATIONS

Johnson, "Maskless EUV lithography, an alternative to e-beam," J. Micro/Nanolith. MEMS MOEMS 18(4), 043501 (2019) https://doi.org/10.1117/1.JMM.18.4.043501.

Deuter et al. "Holographic masks for computational proximity lithography with EUV radiation." International Conference on Extreme Ultraviolet Lithography 2018. vol. 10809. International Society for Optics and Photonics, 2018. https://doi.org/10.1117/12.2502879.

Cheng et al. "Extreme ultraviolet holographic lithography: Initial results." Applied Physics Letters 90.2 (2007): 023116. https://doi.org/10.1063/1.2430774.

Soyan et al. "Extreme ultraviolet holographic lithography with a table-top laser." Alternative Lithographic Technologies. vol. 7271. International Society for Optics and Photonics, 2009. https://doi.org/10.1117/12.814678.

Borisov et al. "Experimental verification of sub-wavelength holographic lithography physical concept for single exposure fabrication of complex structures on planar and nonplanar surfaces." 33rd European Mask and Lithography Conference. vol. 10446. International Society for Optics and Photonics, 2017. https://doi.org/10.1117/12.2279736.

* cited by examiner

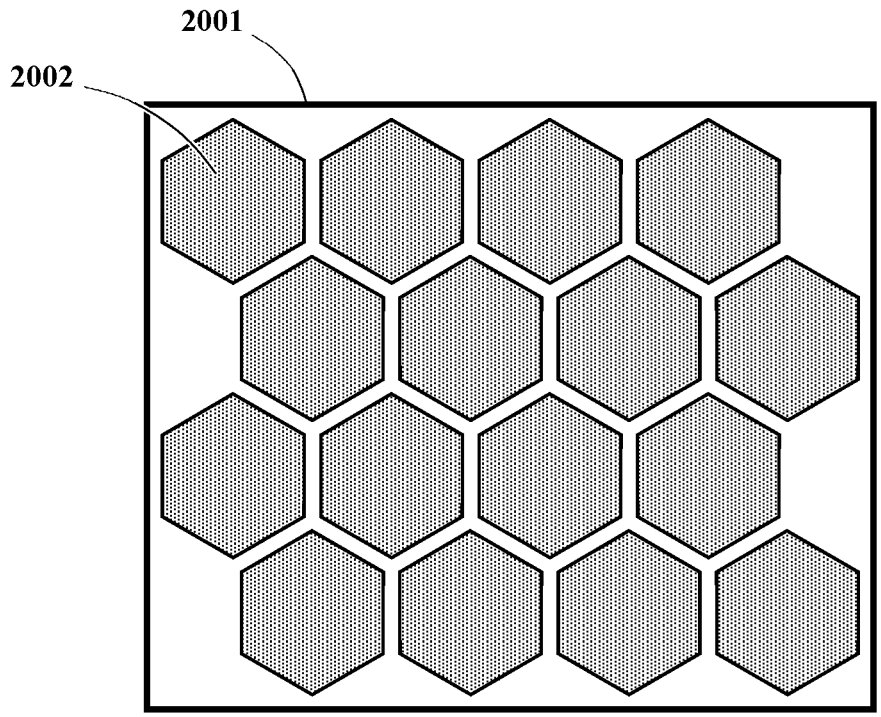

FIG. 20

| | |
|---|---|
| $\lvert \nabla p \rvert = 1/\lambda$ | 21.1 |
| $\hat{\mathbf{u}} = \lambda \nabla p$ | 21.2 |
| $\lvert \hat{\mathbf{u}} \rvert = 1$ | 21.3 |
| $N\hat{\mathbf{u}} = \hat{\mathbf{s}}(\hat{\mathbf{s}}\cdot\hat{\mathbf{u}}),\ T\hat{\mathbf{u}} = \hat{\mathbf{u}} - N\hat{\mathbf{u}},$ $\lvert N\hat{\mathbf{u}} \rvert^2 + \lvert T\hat{\mathbf{u}} \rvert^2 = \lvert \hat{\mathbf{u}} \rvert^2 = 1,$ $\hat{\mathbf{s}}\cdot\hat{\mathbf{u}} = \pm \lvert N\hat{\mathbf{u}} \rvert = \pm\sqrt{1 - \lvert T\hat{\mathbf{u}} \rvert^2}$ | 21.4 |
| $p'_m = p_0 + m\,gp$ | 21.5 |
| $T\hat{\mathbf{u}}'_m = T\hat{\mathbf{u}}_0 + m\,\lambda T \nabla gp\quad (\hat{\mathbf{u}}_0 = \lambda \nabla p_0,\ \hat{\mathbf{u}}'_m = \lambda \nabla p'_m)$ | 21.6 |
| $x_1 = \mathtt{M1\_x1} + \tfrac{1}{2}(c_1\,ss + c_2\,ss^2 + \ldots);$ with $ss = (x_1 - \mathtt{M1\_x1})^2 + x_2^2 + x_3^2$ | 21.7 |
| $gp = pc_1\,ss + pc_2\,ss^2 + \ldots$ | 21.8 |

FIG. 21

| Src_x1 | 93.069859895 mm |
| --- | --- |
| Lens_x1 | -1096.089256032 mm |
| Object_x1 | -1096.007867639 mm |
| M1_x1 | -28 mm |
| M2_x1 | -529.427845421 mm |
| M1: | |
| $c_1$ | 0.00150026516912203 mm$^{-1}$ |
| $c_2$ | 9.147783129092966e-09 mm$^{-3}$ |
| $c_3$ | 7.48343361575382e-14 mm$^{-5}$ |
| $c_4$ | 1.01468643045886e-18 mm$^{-7}$ |
| $c_5$ | 4.11817058645325e-24 mm$^{-9}$ |
| $c_6$ | 6.34051703276089e-28 mm$^{-11}$ |
| M2: | |
| $c_1$ | 0.00160628798459859 mm$^{-1}$ |
| $c_2$ | 1.13303774706633e-10 mm$^{-3}$ |
| $c_3$ | 6.07101246796666e-17 mm$^{-5}$ |
| $c_4$ | 2.35559036791934e-23 mm$^{-7}$ |
| $c_5$ | 2.2401009173088e-29 mm$^{-7}$ |
| $pc_1$ | 0.000297084898207104 mm$^{-2}$ |
| $pc_2$ | -1.17220997696821e-10 mm$^{-4}$ |
| NA | 0.55 |
| NA_inner | 0.125 |
| demag | 6 |

FIG. 24

EUV LITHOGRAPHY SYSTEM WITH DIFFRACTION OPTICS

CROSS-REFERENCE TO RELATED APPLICATION(S)

This application claims the benefit under 35 U.S.C. § 119(e) of the following two applications, both of which name Kenneth C. Johnson as the inventor, and both of which are incorporated by reference in their entirety for all purposes:
  U.S. Patent Application No. 62,911,467, filed Oct. 7, 2019 for "EUV Lithography System with Diffraction Optics;" and
  U.S. Patent Application No. 62,931,323, filed Nov. 6, 2019 for "EUV Lithography System with Diffraction Optics".

The substance of these applications was presented in June 2020 at the 2020 EUVL Workshop, paper P22 (https://euvlitho.com/) and is posted on the vixra.org e-print archive:
  "EUV Lithography Design Concepts using Diffraction Optics", July 2020, https://vixra.org/abs/2007.0167

BACKGROUND OF THE INVENTION

This application pertains primarily to extreme ultraviolet (EUV) lithography in the context of semiconductor and microsystems manufacture. The disclosed methods and apparatus could also be applicable to visible-light, ultraviolet (UV), and deep ultraviolet (DUV) lithography, as well as more general forms of optical imaging other than lithography. (In the context of this disclosure "optical" radiation can encompass any of these wavelength ranges—visible, UV, DUV, and EUV.)

Background patents and non-patent literature references relevant to this application are listed at the end of the disclosure in the References section.

EUV lithography has been under development for two decades, primarily by the Netherlands-based company ASML, which is currently the sole global supplier of commercial EUV lithography systems. A mask-projection lithography scanner of the type manufactured by ASML directs EUV illumination at a 13.5-nm wavelength onto a reflective photomask, which is scanned across the stationary illumination field and is imaged at 4× reduction onto a writing surface, a 300-mm semiconductor wafer. The wafer is also synchronously scanned in the opposite direction to maintain a fixed positional relation between the image and the wafer. The mask and wafer are scanned at a relative speed of about 2 meters per second while their alignment is dynamically controlled to nanometer-scale accuracy. (This level of synchronization accuracy requires compensation for the finite speed of light.) The imaging is performed by a six-mirror projection system. Strick tolerances on optical aberrations require atomic-scale surface shape accuracies over mirrors up to 1-meter diameter. (This is comparable to holding a sub-millimeter shape tolerance over an aperture as large as the continental United States.)

ASML's newest EUV mask-projection scanner, the EXE-5000, which is expected to start shipping in 2023, will have print resolution down to 8-nm half-pitch and print throughput up to 185 wafers per hour. This performance level will come at a cost of about $250 million per system, plus mask costs of order $500,000 each.

Much of the complexity and expense of lithography scanners ("step-and-scan" systems) stems from the need to cover a full wafer die, measuring 26 by 33 mm, in a single scan pass. High-resolution, wide-field imaging is achieved by confining the illumination to a narrow, arc-shaped "ring field" on the mask, across which the mask scans to achieve full-area coverage. Older "steppers" ("step-and-repeat" systems) from the early days of lithography, which image the full mask aperture in a single static exposure step (without scanning), are more limited in how large an image field can be covered with acceptable optical resolution. However, the EXE-5000 relinquishes the full-field scan advantage: It only covers a 26-by-16.5-mm image field in one scan pass and uses field stitching to cover a full 26-by-33-mm die. (Two separate masks are required to pattern the full die field.)

The cost-effectiveness of EUV scanners is limited by power and low optical efficiency, which can, in some cases, necessitate a significant throughput reduction to achieve adequate exposure dose. Also, print quality can be limited by optical shadowing ("3-D effects") in EUV masks resulting from oblique illumination on the mask, which is required to separate the incident and reflected light paths.

The primary alternative to EUV for high-resolution patterning is e-beam lithography, which is less expensive and does not use photomasks, but which has throughput about four orders of magnitude slower than EUV lithography. A primary application of e-beam lithography is EUV mask manufacture ("mask writing"). IMS Nanofabrication (an Austrian subsidiary of Intel Corp.) manufactures a multibeam mask writer, which uses approximately 250,000 parallel e-beam channels to achieve throughput of about 10 hours per mask.

My U.S. Pat. No. 9,097,983 (hereafter '983) and more recent publications (Ref's. 1, 2) disclose a maskless EUV lithography system, which could achieve throughput 2 to 4 times faster than e-beam for mask-writing. This is well below the throughput of mask-projection lithography, but maskless EUV could provide an exposure dose level much higher than either e-beam or mask-projection EUV.

The maskless system uses an EUV microlens array with about 2 million microlens channels, in lieu of a photomask, to condense EUV illumination onto discrete focal points, which are imaged through projection optics onto a writing surface. The surface is raster-scanned across the focus-point array as the points are individually modulated to construct a digitally synthesized exposure image. The surface scan speed is relatively low, e.g. a few millimeters per second. (Only the writing surface is scanned; the microlens array remains stationary.)

The microlenses can be configured to offset and neutralize geometric optical aberrations in the projection system, resulting in relaxed design requirements for the EUV mirrors. Consequently, the maskless system requires only two projection mirrors compared to the six mirrors of commercial EUV mask-projection systems. The benefits of a simplified projection system include lower cost, higher optical efficiency, and comparatively relaxed mirror fabrication tolerances.

The relatively high optical efficiency and high exposure dose of maskless EUV could make it possible to adapt the system for operation at a reduced wavelength of 6.7 nm, which would improve optical resolution by 2× relative to conventional 13.5-nm EUV lithography. (Wavelength reduction might not be feasible for conventional EUV mask-projection lithography due to the very low refractive index contrast of available optical materials for 6.7 nm, which would result in severe mask 3-D effects and a drastic reduction in the EUV mirrors' reflection bandwidth; Ref's. 3 and 4.)

EUV lithography systems use laser-produced plasma (LPP) EUV light sources, which have a broad spectral band. The system transmission bandwidth is 2% of the 13.5-nm operating wavelength for mask-projection EUV lithography, and somewhat higher—3%—for maskless (according to Ref. 2) due to the higher optical efficiency. This creates a problem for maskless lithography because the EUV microlenses are diffractive devices (similar to diffraction gratings), which exhibit significant chromatic aberration over the 3% transmission band. To overcome this limitation, I proposed using a two-stage achromatic lens design (a "Schupmann doublet"; see FIG. 10 in the '983 patent and page 9 in Ref. 1). This would require aligned microlenses formed on opposite sides of a microchannel plate, with micromechanical shutters and data paths sandwiched between the two lens planes. Also, the second lens element in each doublet (the downstream element in the optical path) would need to be accurately blazed to concentrate transmitted light in a first diffraction order with very little optical scatter into other orders. Such lenses are relatively difficult to manufacture relative to binary-optic zone-plate lenses that are more commonly used for EUV applications (Ref. 5).

Another nonstandard lithography method that also makes use of diffractive optics for pattern generation is holographic lithography. U.S. Pat. No. 7,499,149 discloses "a lithographic apparatus and a mask, especially for use with EUV radiation, that is less susceptible to imaging defects caused by dust or damage." The mask is a "holographic patterning device" positioned "in a plane displaced from the best object plane of the projection system" in the lithographic apparatus. The impact of "dust particles or localized damage" on the mask is minimal because the mask is not imaged sharply on the writing surface.

Deuter (Ref. 6) discloses "Holographic Masks for Proximity Lithography Using EUV Radiation". In this system the mask is positioned in close proximity to the writing surface without intervening projection optics. Cheng and Isoyan (Ref's. 7, 8) similarly disclose holographic EUV masks that operate without projection optics, and Borisov (Ref. 9) discloses a holographic mask with a visible-light operating wavelength.

SUMMARY OF THE INVENTION

The following disclosure outlines a new EUV maskless lithography design that uses an array of microlenses to focus EUV illumination onto a corresponding array of focus spots, which are imaged through projection optics (one or more EUV mirrors) onto a writing surface. The surface is scanned and the spots are modulated, in the manner taught by '983 and Ref's. 1 and 2, to form a digitally synthesized exposure image. However, the lenses need not be achromatic in the new design; their chromatic effects can be significantly offset and neutralized by constructing at least one mirror element in the projection optics as a diffractive element.

The lenses can be simple binary-optic zone-plate lenses, similar to lenses that are commonly used for EUV applications. The lenses are formed on one side of a microchannel plate with hollow light-transmission channels, and any optical scatter in extraneous diffraction orders is blocked by the plate or by a spatial-filter aperture array at the lens focal plane on the opposite side of the plate. Micromechanical shutters can also be disposed proximate the lens foci to modulate the individual lens-transmitted beams.

The lenses can alternatively be blazed to concentrate most of the light transmitted through each lens into a single diffraction order, which is directed through the lens focus. This could approximately double the optical efficiency relative to binary-optic lenses. Furthermore, if the lenses do not generate any significant optical scatter within the projection system's angular acceptance range, then it would also be possible to eliminate the spatial-filter apertures and the microchannel plate, leaving the microlenses on an edge-supported, thin-film substrate (a kind of "patterned pellicle"). In this configuration the pattern need not have the form of a microlens array; any kind of diffractive structure can be used to form an arbitrary full-field image, not just a point-array image. The microlens array is thus transformed into an EUV transmission photomask for holographic mask-projection (not maskless) lithography. (The design can alternatively be configured to use a reflection mask.)

In this operational mode the illumination need not be modulated and the image pattern is not scanned; it is statically projected onto the writing surface to expose a full image field. Larger fields of unlimited size can be exposed via field stepping and stitching. The mask is "holographic" because it is not imaged directly onto the writing surface; it operates via diffraction to form an optical pattern on the projection system's object pane, which is imaged onto the writing surface. (The mask can be on either side of the object plane.)

The diffractive image will be affected by chromatic aberration, but the chromatic effects can be substantially neutralized by a diffractive projection mirror or mirrors in the same manner as the maskless design. Also, either the microlenses in a maskless system or the photomask in a holographic mask-projection system can control the phase of the diffracted radiation to offset and neutralize geometric optical aberrations in the projection system. Thus, the microlenses or holographic mask operate in combination with the diffractive mirror or mirrors to substantially neutralize both geometric and chromatic aberrations.

BRIEF DESCRIPTION OF THE DRAWINGS

FIG. 20 illustrates a holographic mask with multiple exposure patterns.

FIG. 21 tabulates equations pertaining to the mathematical description of lithography systems.

FIG. 24 tabulates illustrative design data for a Schwarzschild projection system similar to FIG. 1.

DESCRIPTION OF SPECIFIC EMBODIMENTS

Maskless EUV lithography scanner

Figure 1:
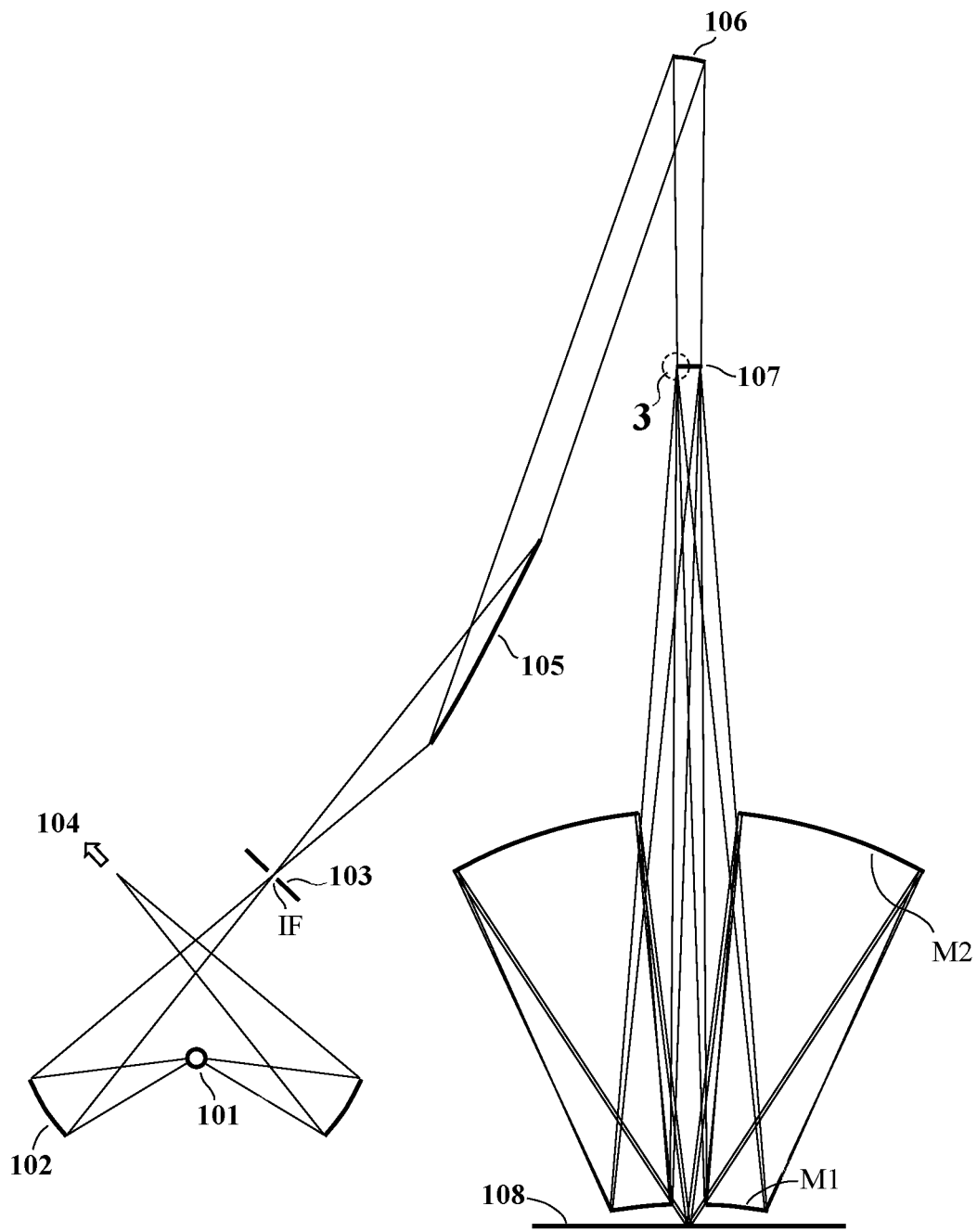
FIG. 1 shows a schematic cross-sectional view of a maskless EUV lithography scanner.

FIG. 1 shows a schematic cross-sectional view of a maskless EUV lithography scanner, in an illustrative embodiment. An LPP plasma 101 generates EUV radiation, which is focused by an ellipsoidal collection mirror 102 to an intermediate focus IF, where it is spatially filtered by a small aperture 103. (A portion 104 of the LPP power may be diverted to one or more other similar scanner modules.) The IF-transmitted radiation is directed by illumination optics comprising two illumination mirrors, grazing-incidence element 105 and near-normal-incidence element 106, onto microlens array 107. (Many alternative design forms for the illumination optics are possible.) The microlenses partition the radiation into a large number of individual convergent beams (e.g., approximately 2 million). A projection system comprising two axially-symmetric, annular mirrors M1 and M2 focuses the beams onto an array of diffraction-limited focal spots on a writing surface 108 at the projection system's image plane. (The projection mirrors are a variant of the a flat-image Schwarzschild design, Ref. 10, adapted to operate at finite conjugate.) The beams are individually modulated as the surface 108 is scanned across the spot array to synthesize a digital, high-resolution raster image.

Figure 2:
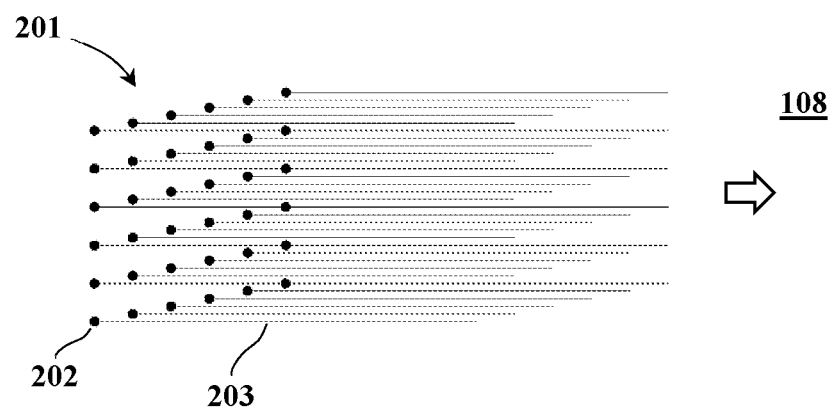
FIG. 2 schematically illustrates the maskless scanner's scan process.

FIG. 2 schematically illustrates the scan process. The focal spot array 201 writes a raster line pattern as the writing surface 108 scans from left to right in the figure. For example, spot 202 writes line 203. Practical variations of the scan process are described in detail in Ref's. 1 and 2.

Figure 3:
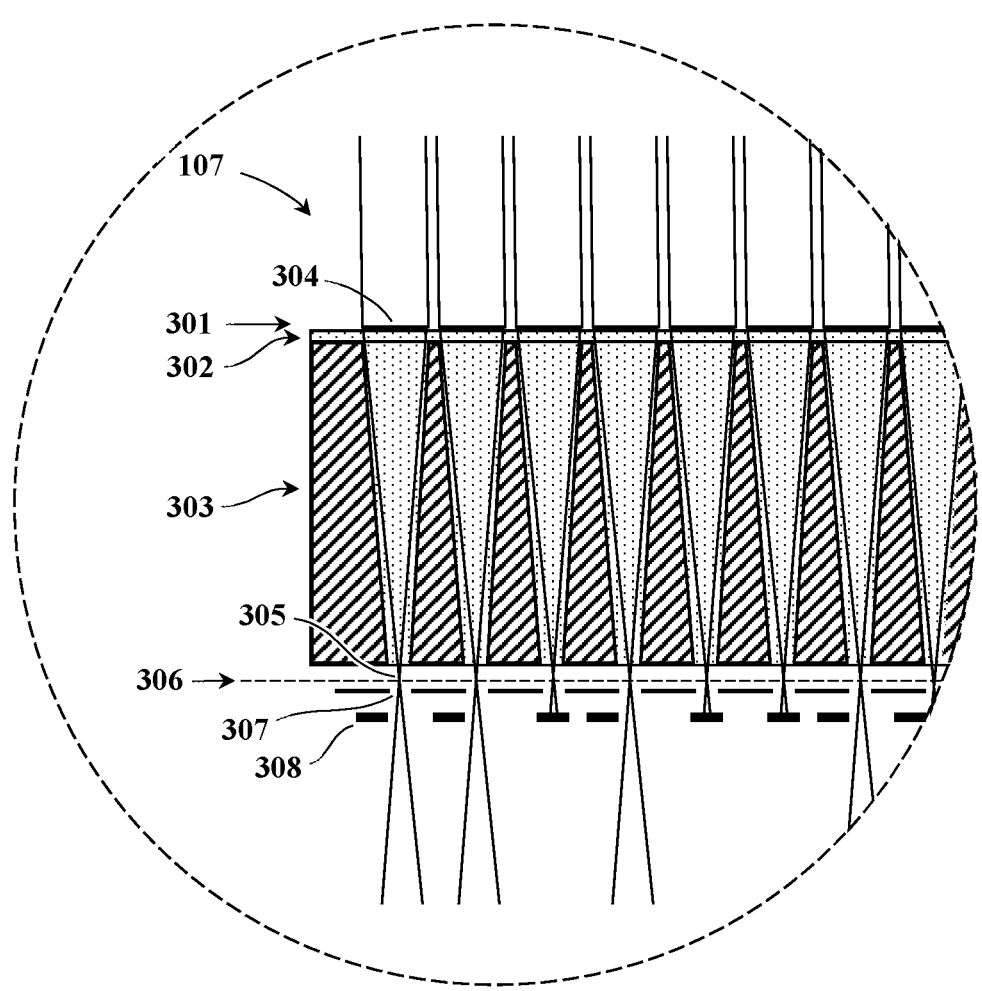
FIG. 3 shows a schematic cross-sectional view of the maskless scanner's microlens array and supporting microchannel plate.

FIG. 3 shows an enlarged cross section of the microlens array 107 in FIG. 1, which is formed as a structured, topographic pattern layer 301 on a transparent substrate 302, supported by a microchannel plate 303. Each microlens, such as element 304, focuses illumination into a beam converging toward and through a focal point 305 on the projection system's object plane 306. (Illustrative dimensions are 15 microns for the lens diameter and 81 microns for the lens focal length and plate thickness.) Conical holes are formed in the plate to accommodate the beam paths. An array of small apertures at the focal plane, such as aperture 307, can be used to spatially filter the focused beams.

Micromechanical shutters, such as shutter 308, modulate the beams at or near the focal points in synchronization with the LPP pulse rate. Alternatively, the shutters can be omitted and the beams can be collectively modulated at the LPP source (e.g., by modulating the LPP drive laser intensity or targeting). A source-modulated scanner would be limited to printing periodic patterns matching the focus spot periodicity on the writing surface.

Figure 4A:
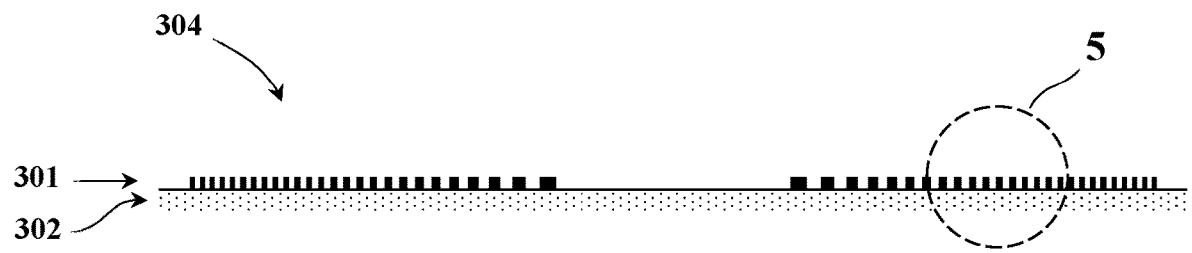
FIGS. 4A and 4B show schematic cross-sectional and plan views of one microlens element of the microlens array.
Figure 4B:
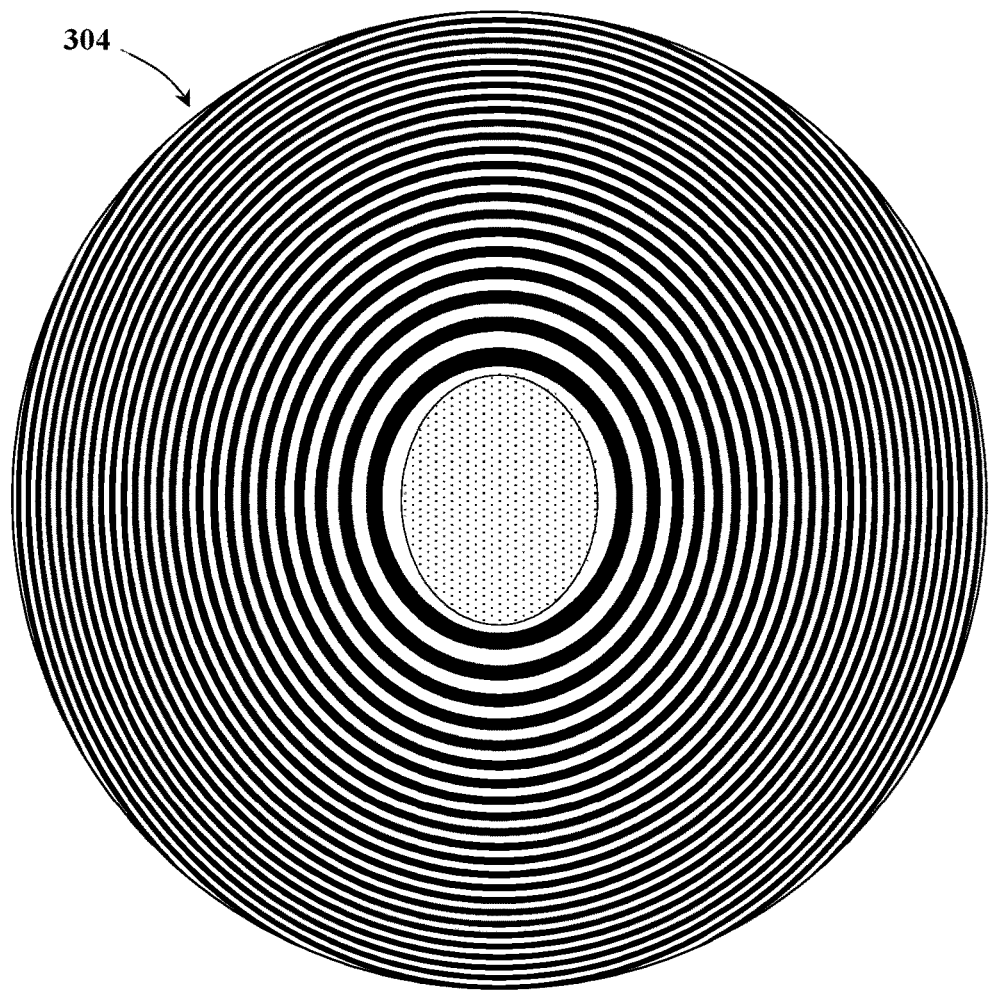
Figure 5:
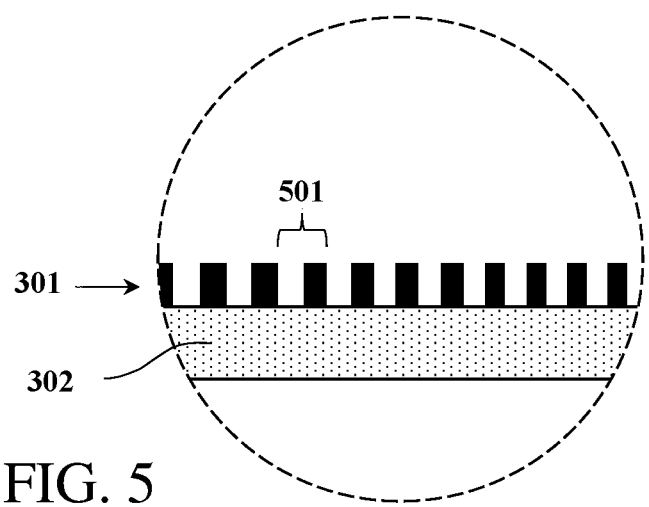
FIGS. 5, 6, and 7 illustrate alternative embodiments of the diffractive structure on a microlens.
Figure 6:
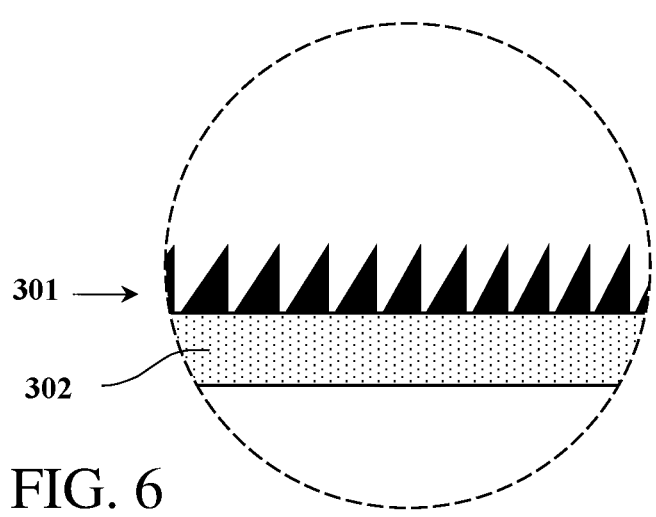
Figure 7:
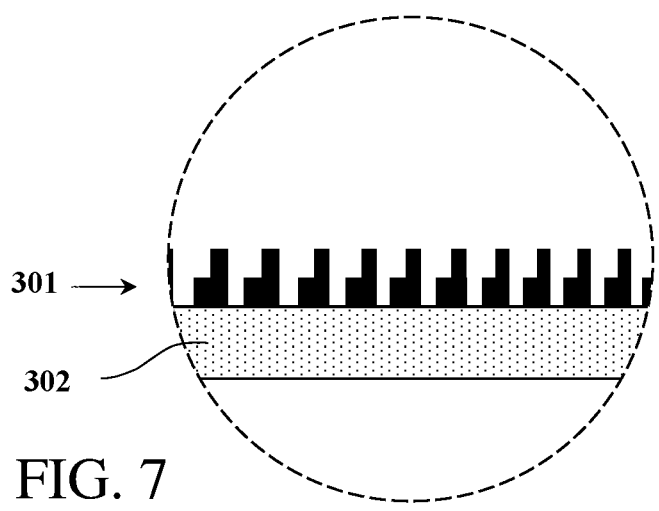

Microlens element 304 is illustrated in FIG. 4A in cross-section, and in FIG. 4B in plan view. An expanded cross-sectional view of the diffractive lens profile is illustrated in FIG. 5, and in two alternative embodiments in FIGS. 6 and 7. The profile geometry is similar to a diffraction grating. FIG. 5 shows a binary zone-plate lens profile; FIG. 6 shows a linear-ramp, blazed lens profile; and FIG. 7 shows a stepped, multi-level blazed lens profile. (Two levels are illustrated in FIG. 7, but higher optical efficiency could be obtained with more levels.) Blazed lenses (FIG. 6 or 7) would be preferred for high efficiency, but conventional binary zone-plate lenses (FIG. 5) can be more easily manufactured. Each lens comprises a pattern of concentric, annular phase zones (annular line-space pairs), such as zone 501, formed by etching a phase-shift topographic pattern into layer 301 on the substrate 302. In the illustrative design there are approximately 24 phase zones (FIG. 4B), and the minimum zone width (grating period) is approximately 1% of the lens diameter (e.g., 150 nm width for a 15-micron diameter).

For a 13.5-nm operating wavelength the phase-shift layer 301 would typically be molybdenum (Mo) and the substrate 302 could be silicon (Si). The profile depth (Mo layer thickness) would typically be approximately 85 nm for a binary lens (FIG. 5), or somewhat higher for a blazed lens; and the Si substrate could be approximately 50- to 100-nm thick. (Practical fabrication details for these types of lenses are discussed in Ref. 5.) For a 6.7-nm operating wavelength, the phase-shift layer could be lanthanum (La), approximately 200-nm thick for a binary lens, and the substrate could be boron carbide ($B_4C$), approximately 100- to 200-nm thick. The phase-shift layer could alternatively be a lanthanum compound such as lanthanum nitride (LaN) or lanthanum carbide ($LaC_2$).

The lens aperture can be circular in FIG. 4B, but the annular phase zones are slightly elliptical and distorted to compensate for optical aberration (e.g., astigmatism) in the projection system. The focused beam is significantly aberrated at focal point 305 (FIG. 3), but the lens 304 generates an optical wavefront that emerges from the projection system as a substantially aberration-free, spherical, point-convergent wave. (The spatial filter apertures such as aperture 307 can be underfilled to avoid interfering with the aberration correction function.)

The lenses can achieve substantially perfect aberration correction at a particular design wavelength, but singlet lenses will exhibit significant chromatic aberration over the operating wavelength range. (A diffractive lens operates in a manner similar to a diffraction grating, which is chromatically dispersive.) Rather than using an achromatic doublet lens, as in '983 and Ref's. 1 and 2, the chromatic aberration is corrected by using a diffractive projection mirror M2, which is illustrated schematically in cross-section in FIG. 8A and in plan view in FIG. 8B. The mirror surface comprises annular, concentric phase zones, depicted schematically as concentric circles in FIG. 8B. An illustrative mirror diameter is 600 mm, and the number of phase zones is approximately the same as the microlenses, e.g. 24, as illustrated. These conditions imply a minimum zone width of approximately 6 mm on M2.

The mirror phase zones induce an optical phase shift in the reflected radiation in a manner similar to a diffraction grating. The zone structure is blazed to substantially concentrate the diffracted light into a single diffraction order, and the chromatic aberration induced by the diffractive mirror substantially offsets and neutralizes that of the diffractive microlenses. (The chromatic correction is not perfect because the mirror is constrained to being axially symmetric. But it can reduce the chromatic aberration to a level that may be substantially negligible.)

Figure 8A:
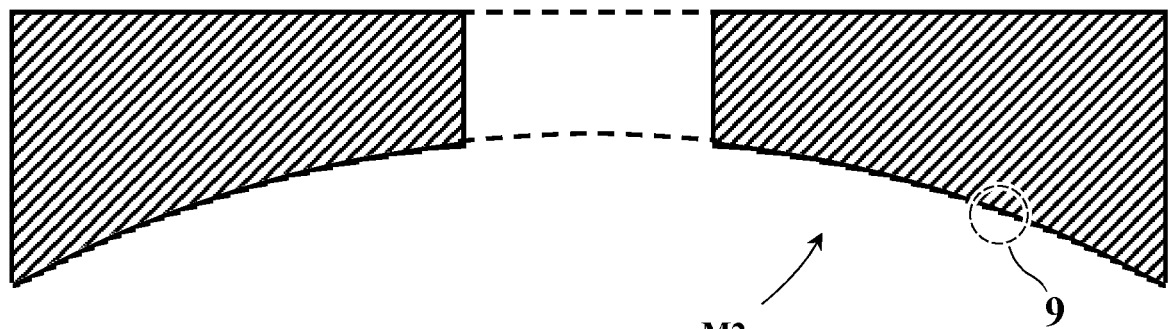
FIGS. 8A and 8B show schematic cross-sectional and plan views of a diffractive projection mirror, which operates to correct chromatic aberrations in the maskless scanner.
Figure 9:
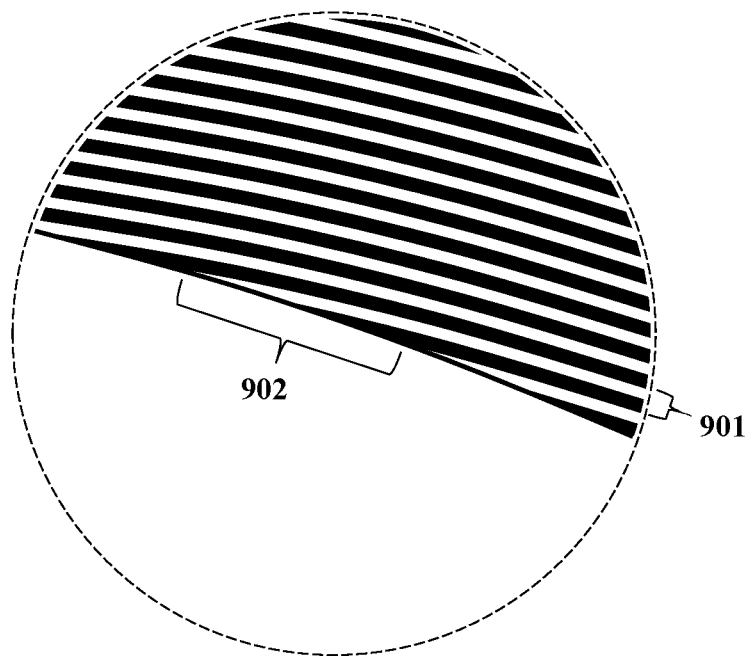
FIGS. 9 and 10 illustrate alternative embodiments of the diffractive structure on the diffractive projection mirror.

An expanded cross-sectional view of the diffractive mirror structure in FIG. 8A is illustrated in FIG. 9. A conventional EUV mirror reflection coating, e.g. for a 13.5-nm operating wavelength, is first constructed by depositing alternate layers of Mo and Si on the mirror substrate, with a typical Mo/Si bilayer thickness in the range of 7 to 10 nm. (One bilayer is indicated as 901.) The total number of deposited bilayers would typically be around 70 or more. An ion-beam finishing (IBF) process is then applied to the multilayer stack to ion-mill a bowl-shaped depression traversing the layers, and a protective top coat (e.g. a couple nanometers of Si or ruthenium) is then deposited to prevent oxidation of the Mo. The phase zones are demarked by the intersections of the bilayer boundaries with the IBF-processed top surface (e.g. zone 902 is demarked by bilayer 901 boundaries).

IBF processes are routinely used in optical manufacturing, e.g. with IBF tools manufactured by Buhler, a company based in Switzerland. Similar processes have been applied to EUV mirrors. U.S. Pat. No. 7,050,237 (hereafter '237) discloses an EUV multilayer cut at a shallow angle, which has "the same properties as a blazed grating, and has been demonstrated to have near-perfect performance." The cut is made either by mechanical or ion-beam polishing (similar to IBF). Either method could be applied to manufacture chromatic dispersion-compensating mirrors of the form illustrated in FIG. 9. FIG. 3 in '237 illustrates an ion-beam polishing process using a broad-area ion beam and a movable mask. (The Buhler IBF systems do not require masking; they raster-scan a small-area ion beam across the workpiece to form the desired surface shape.)

Figure 8B:
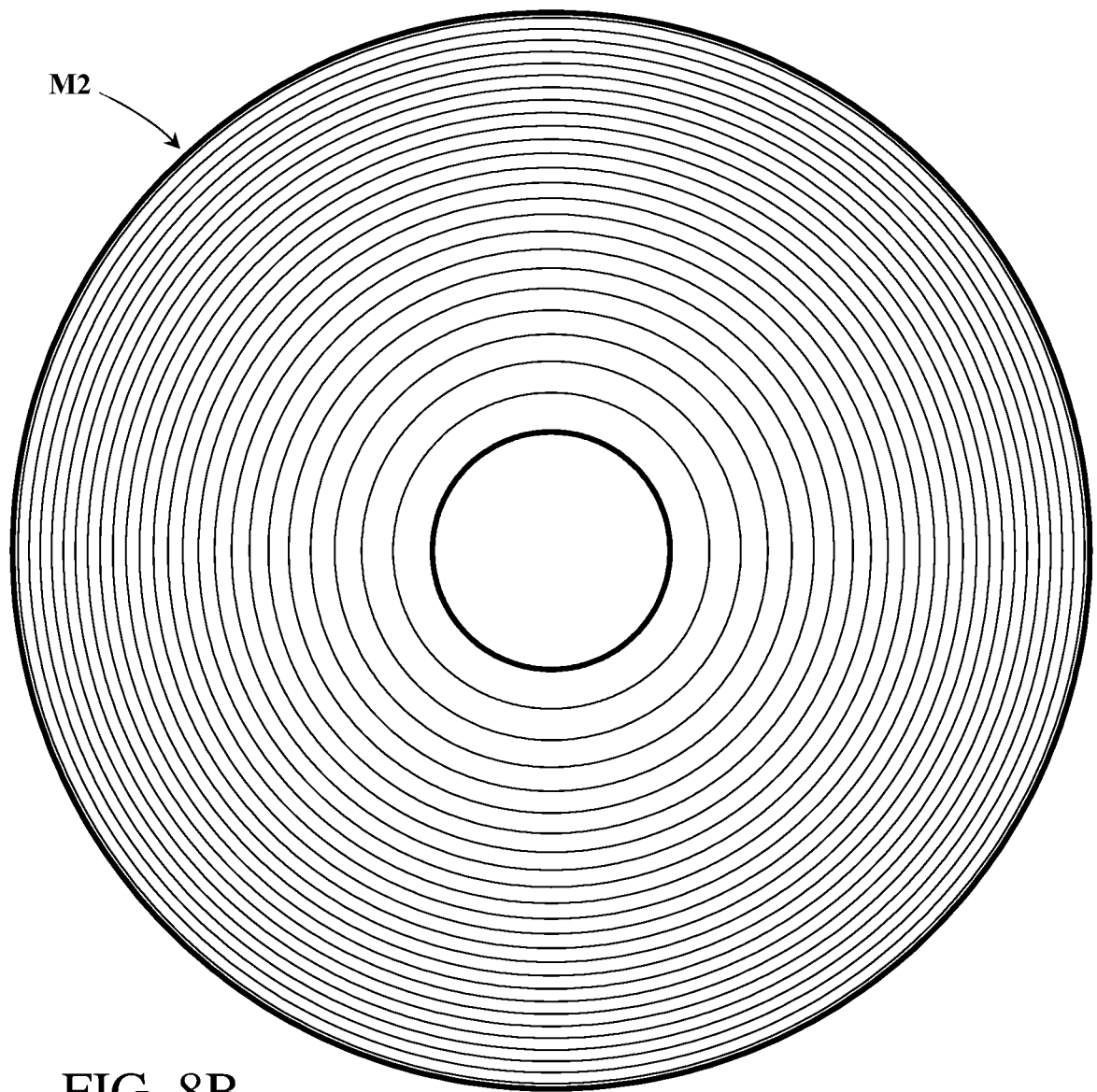

The diffractive structures disclosed in '237 require thousands of Mo/Si bilayers to form a grating of significant area. By contrast, the dispersion-compensating mirror of FIGS. 8A and 8B requires relatively few bilayers. The number of bilayers that are cut by the IBF process is equal to the number of diffractive phase zones on the mirror, e.g., about 24 as illustrated in FIG. 8B. Tsuru (Ref. 11) also discloses ion milling of EUV multilayer mirrors, in this case for the purpose of correcting mirror figure errors to the 0.1-nm level. (This application is unrelated to chromatic dispersion.)

Figure 10:
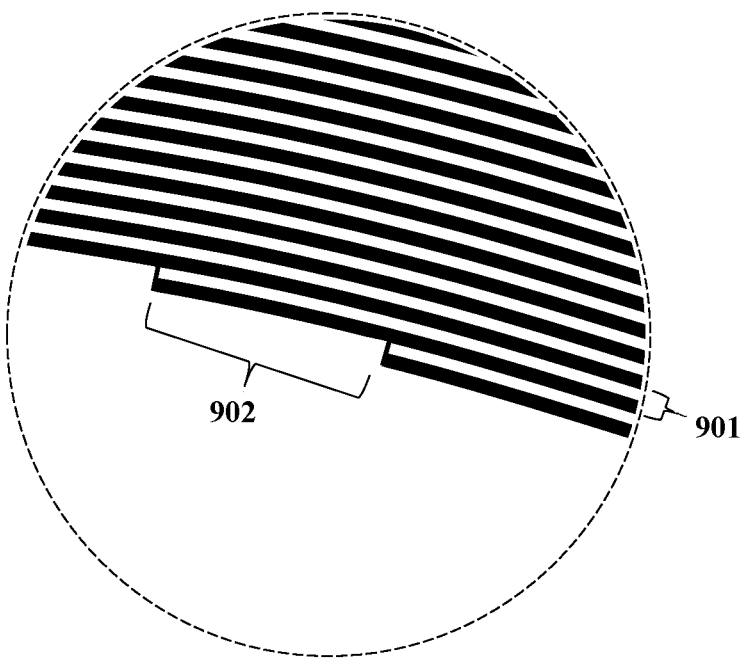

The diffractive mirror structure can alternatively be formed by a selective deposition process. Mo/Si layers are typically deposited using magnetron sputtering, and a mask could be placed proximate to or in contact with the mirror surface during deposition of each layer to delimit the deposition area. (Even with conventional, non-diffractive EUV mirrors some form of deposition masking is typically required to control the Mo/Si layer thickness distribution across the mirror aperture.) Masking processes, either with ion-beam polishing or deposition, could result in a diffractive structure with discontinuous zone boundaries as illustrated in FIG. 10.

There are other alternative approaches that can also be used for manufacturing diffractive EUV mirrors. For example, a blazed profile structure with a typical depth in the range of 7 to 10 nm can be formed in the mirror substrate (e.g., via grayscale lithography), after which a multilayer Mo/Si reflection coating is conformally deposited on the substrate. (Structures of this type are illustrated, for example, in Ref. 12.)

The illustrative mirror materials and dimensions discussed above are applicable to a 13.5-nm operating wavelength. For a 6.7-nm wavelength, Mo and Si would be replaced by materials such as La (or a La compound such as LaN or $LaC_2$) and $B_4C$ (Ref. 4) and the bilayer thicknesses would be reduced by about a factor of 2. These materials have relatively low refractive index contrast, so many more bilayers (e.g. ~200) would be required to achieve high reflectivity, and the mirror reflection bandwidth at wavelength 6.7 nm will be much narrower than a Mo/Si mirror at wavelength 13.5 nm. Due to the narrower bandwidth, it might be possible to operate the system without chromatic aberration compensation, in which case a diffractive projection mirror (or achromatic microlenses) would not be required.

Similar dispersion-compensating mirrors could be used for visible-light, UV, or DUV systems. The mirror could use a multilayer-dielectric reflection coating analogous to EUV Mo/Si coatings. Alternatively, an aluminum reflection coating could be conformally deposited on a blazed substrate structure (similar to spectrometer reflection gratings).

Diffractive mirrors formed by the above-described IBF process (similar to FIG. 9 or FIG. 10) could also be used general-purpose optical systems requiring diffractive mirrors—either for EUV or for visible, UV, or DUV wavelengths.

Holographic Mask-Projection Lithography

Figure 11:
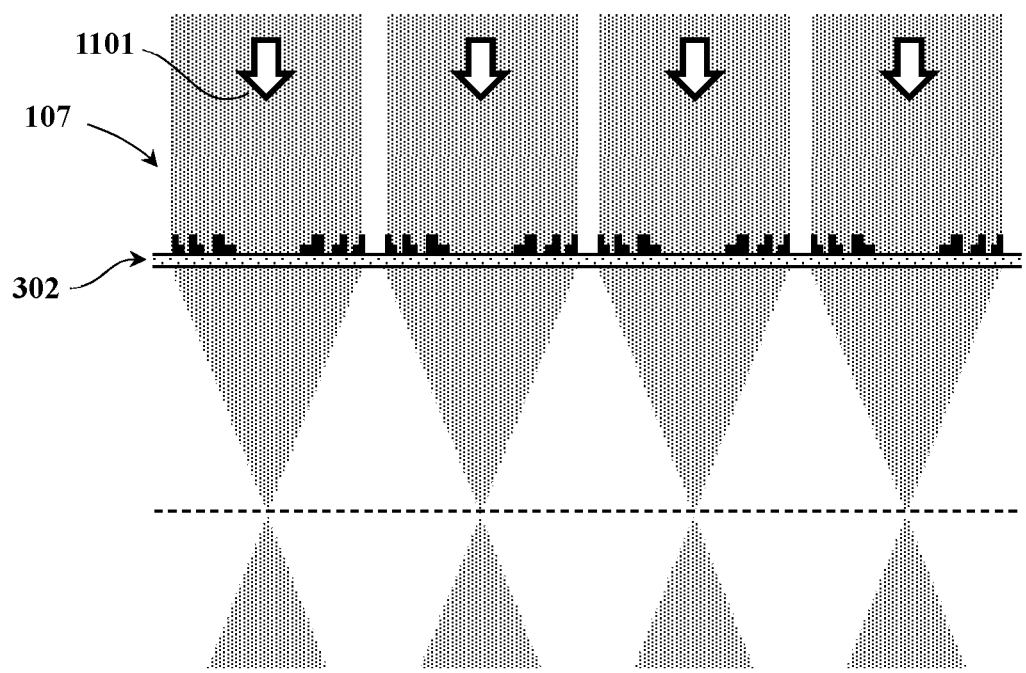
FIG. 11 schematically illustrates a microlens array on an edge-supported substrate, with no supporting microchannel plate.
Figure 12A:
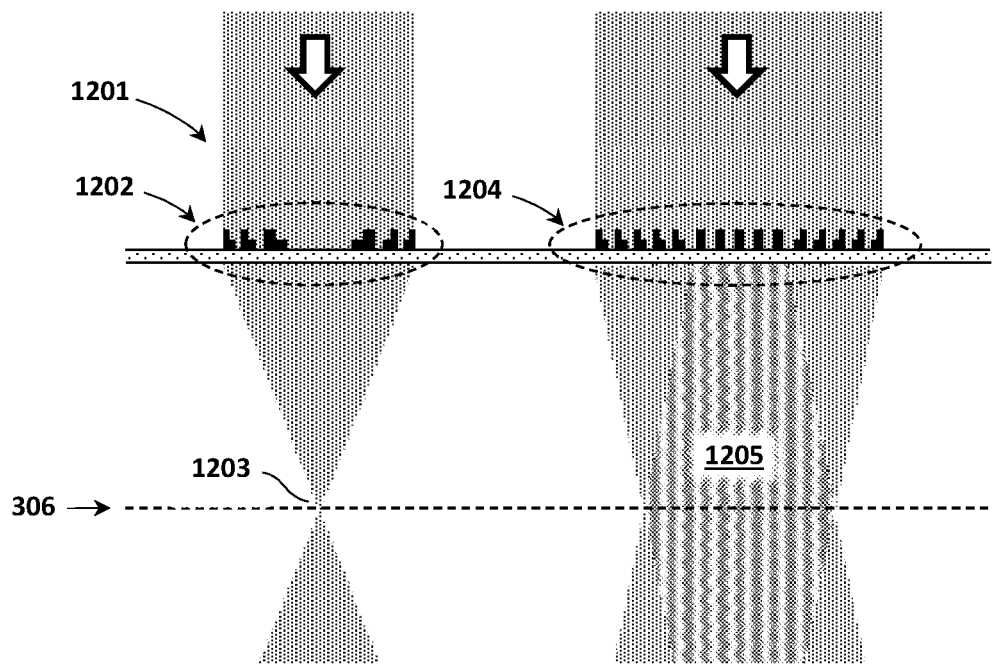
FIGS. 12A-B and 13 schematically illustrate alternative embodiments of a holographic EUV transmission mask.

Referring back to FIG. 3, the microchannel plate 303 and spatial-filter apertures 307 would not be needed for stray light suppression and could be eliminated if the microlenses are blazed (as in FIG. 6 or 7) to suppress optical scatter from extraneous diffraction orders within the projection system's angular acceptance range (the range of diffraction directions entering the projection system, FIG. 1). This would leave a microlens array 107 on a thin, edge-supported substrate 302, as illustrated schematically in FIG. 11. (The illumination 1101 and convergent beams are depicted as shaded areas in FIG. 11.) But in this configuration the pattern need not have the form of a microlens array. Any kind of diffractive structure can be used to form an arbitrary full-field image, not just a point-array image. Thus, the microlens array can be transformed into a transmission mask and the same optical system (FIG. 1) can be used for mask-projection (not maskless) lithography. For example, FIG. 12A schematically illustrates a mask 1201 comprising a portion 1202 that focuses illumination to an isolated point 1203 on the object plane 306 in the same manner as a microlens in a maskless system. Another portion 1204 of the mask has the form of a diffraction grating, which creates a dense line/space pattern via interference between the grating's plus-first and minus-first diffraction orders. The interference pattern between intersecting diffraction orders is illustrated as the banded area 1205, indicating areas of constructive and destructive interference. (This is basically a small-scale implementation of interference lithography, Ref. 13.) Other types of structures can be used to form a variety of image patterns.

Figure 12B:
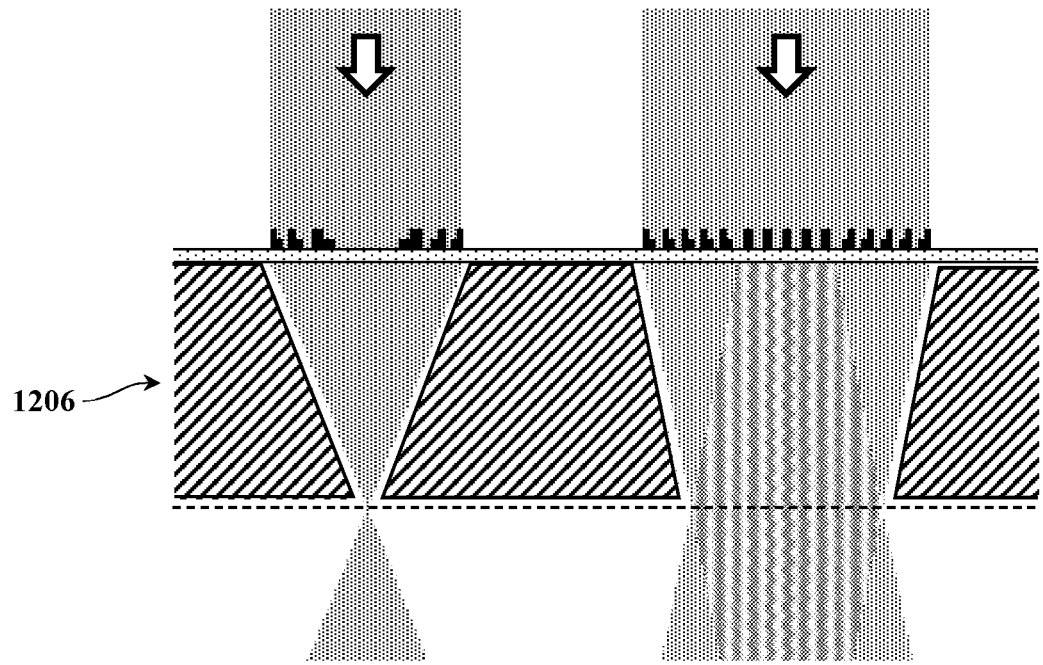

If the exposure image consists of area-limited structures created by non-overlapping mask patterns (such as patterns 1202 and 1204 in FIG. 12A), then the mask could be formed on a supporting plate, similar to microchannel plate 303 in FIG. 3, with hollow channels or windows for beam transmission. For example, FIG. 12B illustrates a variation of the FIG. 12A structure with a backing plate 1206 providing structural support.

In the mask-projection operational mode the illumination need not be modulated and the pattern is not scanned; it is statically projected onto the writing surface to expose a full image field, and larger fields of unlimited size are exposed via field stepping and stitching. (A standard-size mask can accommodate separate patterns for multiple exposure fields, so the stitching process would not necessarily require any mask changes.) Writing throughput would not be limited by any modulator frame rate or by the LPP source repetition rate, so mask-projection lithography could achieve higher throughput than maskless lithography.

Figure 13:
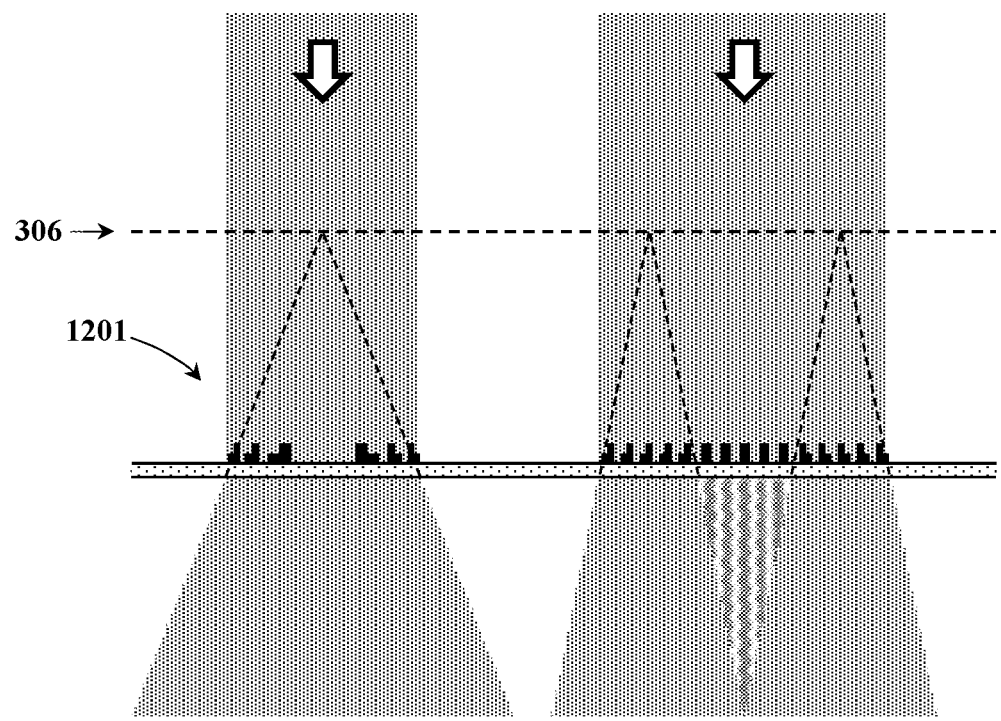

This form of mask-projection lithography is "holographic" because the mask 1201 (a holographic mask) is not imaged directly onto the writing surface; it rather forms a diffractive (holographic) image on the projection system's object plane 306 some distance from the mask, and that intermediate image is projected onto the writing surface. The object plane can be on either side of the mask. In FIG. 12A it follows the mask in the optical path; FIG. 13 illustrates an alternative embodiment in which it precedes the mask.

Alternatively, a holographic mask could be used in a scanning mode similar to maskless lithography, in which the writing surface is continuously scanned across the image field while it is being exposed. This mode of operation could be used, e.g., for printing extended lines or blanket area exposures. A holographic mask would provide more flexibility than maskless lithography with a microlens array because the exposure pattern need not be limited to a periodic point array.

Holographic lithography, like maskless, can correct projection system aberrations and image distortion. The optical pattern on the writing surface can be viewed as an integral superposition of point images, each of which is generated by a point-convergent spherical wave originating from the mask. The wave shape is generally not exactly spherical in the vicinity of the mask; it has a shape determined so that after passing through the projection system the wave emerges as a spherical, point-convergent wave. With broadband illumination the wave shapes will be wavelength-dependent, leading to chromatic aberration, but the chromatic effects can be substantially neutralized with a diffractive projection mirror or mirrors in the same manner as maskless lithography (FIGS. 8A-10).

In comparison to conventional mask-projection lithography in which the mask is located at the object plane, holographic lithography would tend to be less sensitive to isolated mask defects because the defects are not in focus at the image plane. In addition, holographic lithography could achieve much higher exposure dose levels, especially for isolated patterns, because it operates by diffractively focusing, rather than absorbing ("masking") the illumination. For example, a conventional mask would produce an isolated point image by forming a very small transmittance window on an opaque mask layer, whereas a holographic mask could focus illumination from a much larger illumination area onto the point.

Holographic lithography would typically operate as a "step-and-repeat" system in which the mask and writing surface are substantially stationary during image exposure, in contrast to conventional mask-projection scanners in which the mask and writing surface are concurrently scanned across the illumination field. The fixed positional relationship between the holographic mask and the projection system makes it possible for the mask to correct projection system aberrations, and accurate alignment of the system components can be more easily maintained when the elements are stationary. (But as noted previously, the writing surface could alternatively be continuously scanned during exposure.)

An isolated image point in a holographic lithography system is basically a diffraction-limited image of the source. The LPP source would need to be sufficiently compact, or should be spatially filtered by a sufficiently small IF aperture 103 (FIG. 1), to achieve diffraction-limited source imaging. Also, diffraction-limited imaging necessitates illumination optics between the IF and mask that provide illumination with minimal angular spread at each mask point. A holographic stepper uses full-field illumination optics, which facilitate diffraction-limited source imaging. Conventional EUV scanners generally use dispersive illumination optics and ring-field illumination, which would not be useful for holographic lithography because they would not produce a well-resolved source image.

Figure 14A:
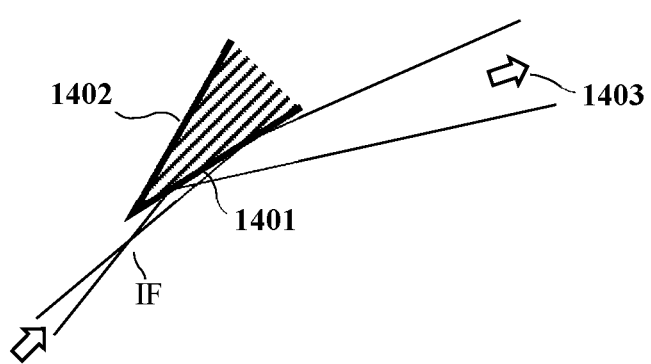
FIGS. 14A-B illustrate a beam-switching mechanism comprising two grazing-incidence EUV mirrors.
Figure 14B:
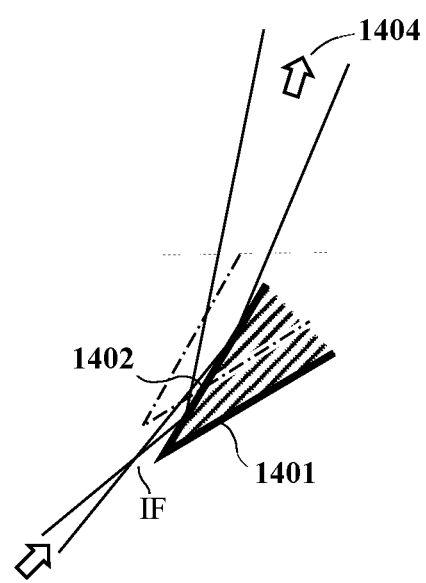

A holographic mask-projection stepper will spend a significant amount of time stepping between exposure fields and performing pre-exposure alignment operations. The writing surface is repositioned between exposures, and if the image pattern is changed then the mask is also repositioned or replaced with a different mask. This could leave the LPP source idle during field stepping. However, source utilization can be maximized by switching the illumination beam between two or more or stepper modules so that one module can be exposing an image while the other modules are being stepped. Beam switching can be effected by a movable mirror or diffraction grating in the beam path near the intermediate focus. For example, FIGS. 14A and 14B illustrate a beam-switching mechanism comprising two EUV beam-deflection mirrors 1401 and 1402 proximate the IF, which are translationally moved to effect beam switching between two optical paths 1403 and 1404. A translationally actuated diffraction grating or gratings (either transmission or reflection gratings) could be alternatively used in lieu of mirrors.

Figures 15A, 15B:
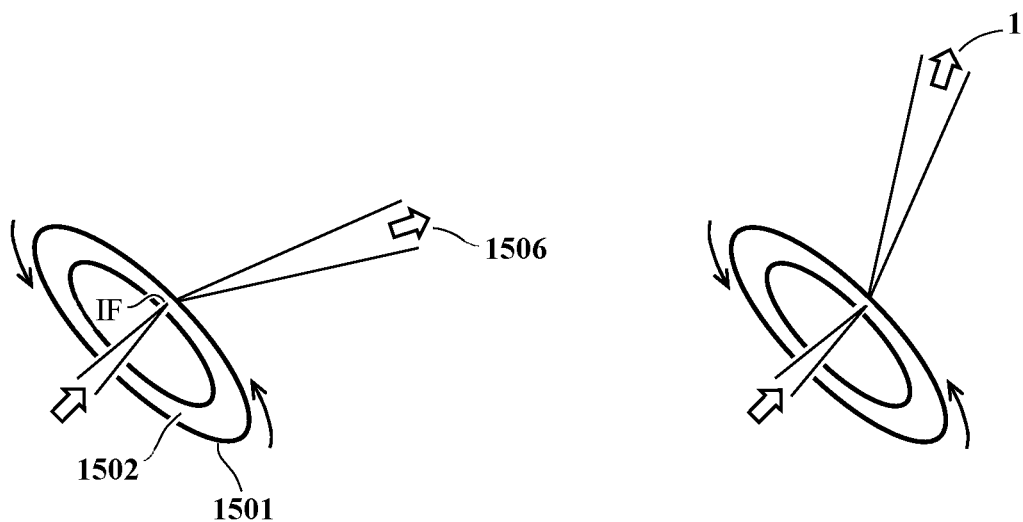
FIGS. 15A-D illustrate a beam-switching mechanism comprising an EUV transmission grating on a rotating disk.
Figure 15C:
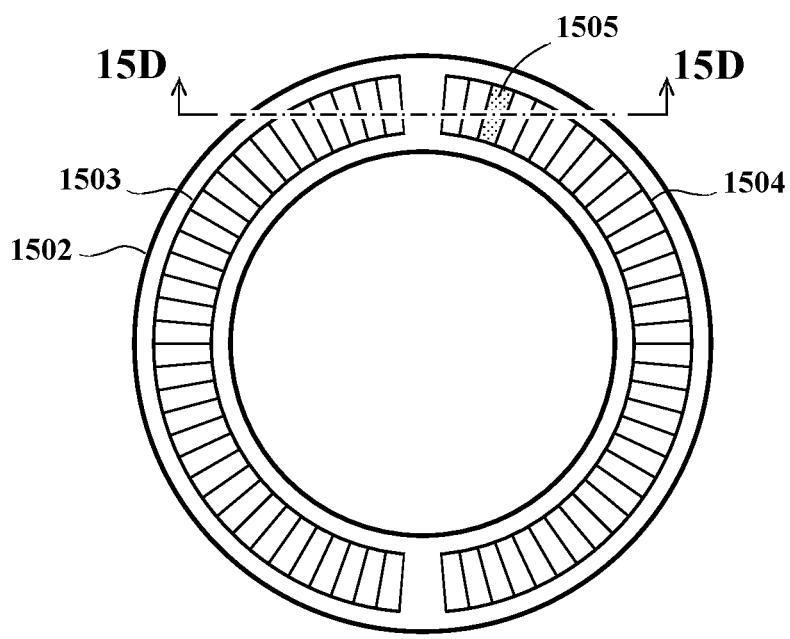
Figure 15D:
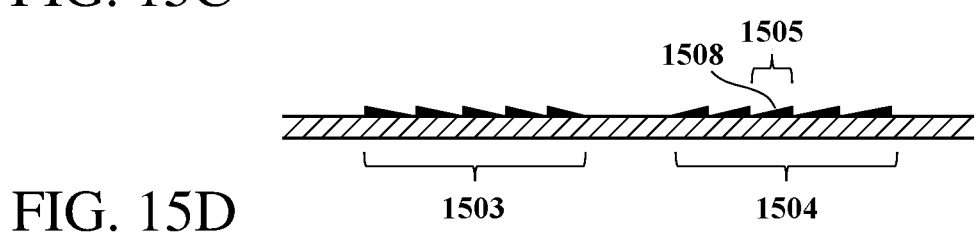

FIGS. 15A-D illustrate an alternative beam-switching mechanism comprising a rotating disk 1501 with an EUV-transmission diffraction grating (e.g. a Mo phase-shift pattern on a thin Si substrate) formed over an annular aperture 1502 near the edge of the disk. The disk is illustrated in perspective view in FIGS. 15A and 15B, and in plan view in FIG. 15C. The grating aperture is divided into two or more subapertures (e.g. subapertures 1503 and 1504) and the grating structure in each subaperture is configured so that the diffracted beam does not move while the beam intercepts the moving subaperture. For example, the grating can comprise radial zones such as zone 1505. The two subapertures effect beam switching by deflecting the beam in different directions. FIGS. 15A and 15B illustrate two beam directions 1506 and 1507. The two subapertures could, for example, be constructed as blazed transmission gratings with similar zone geometries, but with opposite blaze orientations, as illustrated by the cross-sectional view in FIG. 15D. The sawtooth structure represents the blazed grating facets, such as facet 1508 on zone 1505. The grating substrate could alternatively be conical, cylindrical, or any cylindrically symmetric shape. Also, a reflection grating could alternatively be used in lieu of a transmission grating. The beam-switching grating might induce some optical aberration in the transmitted beam, which can be corrected in the illumination optics (e.g., mirrors 105 and 106 in FIG. 1).

Figure 16:
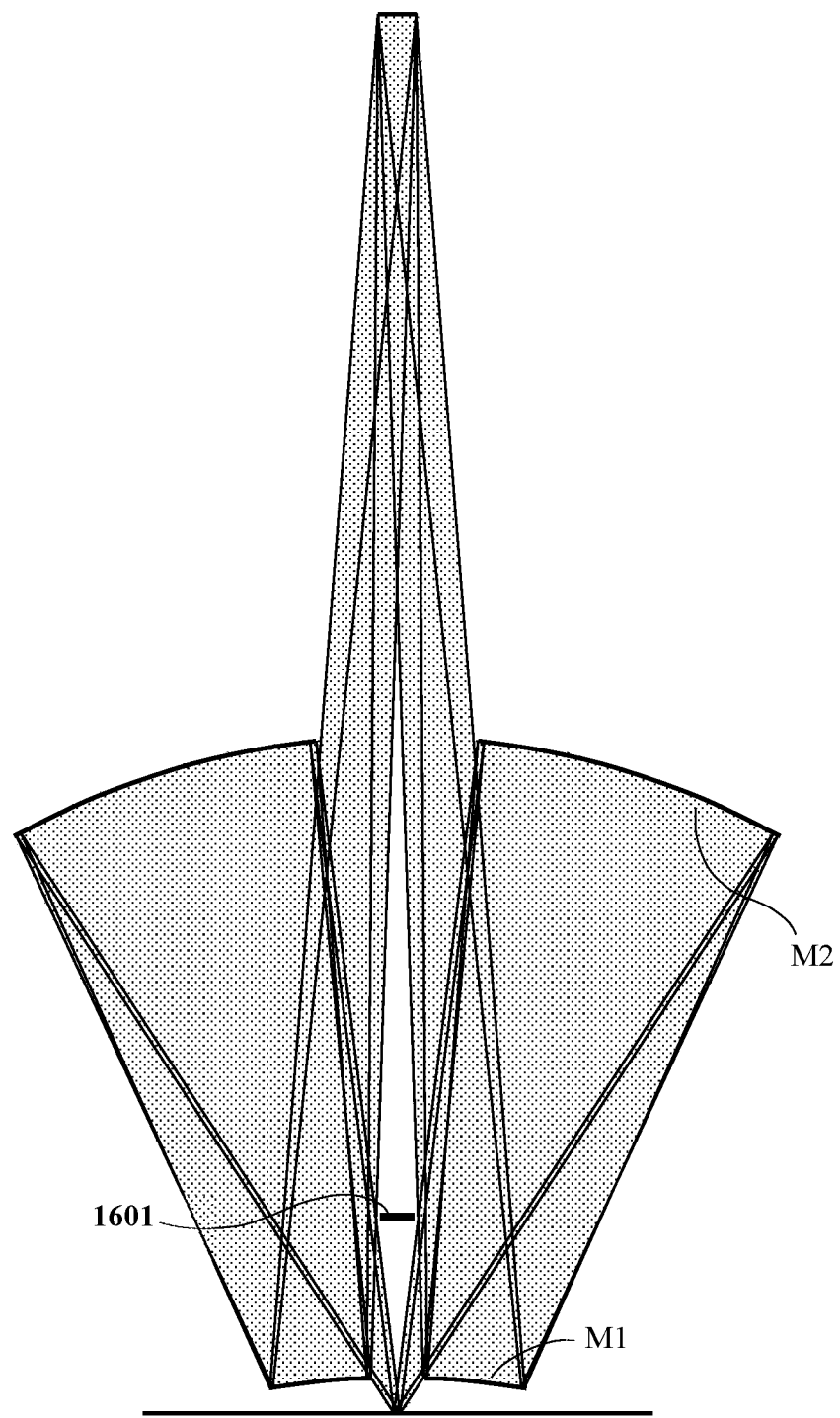
FIG. 16 illustrates EUV projection optics including a zero-order stop.

The optical design of a holographic mask can be simplified by incorporating a zero-order stop in the projection optics of FIG. 1. As illustrated in FIG. 16, the annular mirror M1 and M2 apertures create a central obscuration zone (i.e., a shadow region) in which a zero-order stop (blocking mask) 1601 can be inserted. (The stop can be supported by either spider vanes, tension wires, or a pellicle crossing the optical path, not shown.) This simplifies the mask design because there is no need for zero-order extinction. For example, portions of the mask that are intended to produce a dark (zero-intensity) image can simply be unpatterned; there is no need for an absorber or diffractive extinction of the zero order. The system operates in darkfield imaging mode. If a bright field is needed (e.g. for flood exposure or area fill) then a blazed phase grating can be formed on the mask to direct radiation outside of the obscuration zone. An area-fill exposure pattern can also be made by doing two exposures of a two-beam interference pattern (such as pattern 1205 in FIG. 12A) with the writing surface displaced by half of the image period between exposures. Alternatively, and isolated line image can be scanned to cover and extended area.

Figure 17:
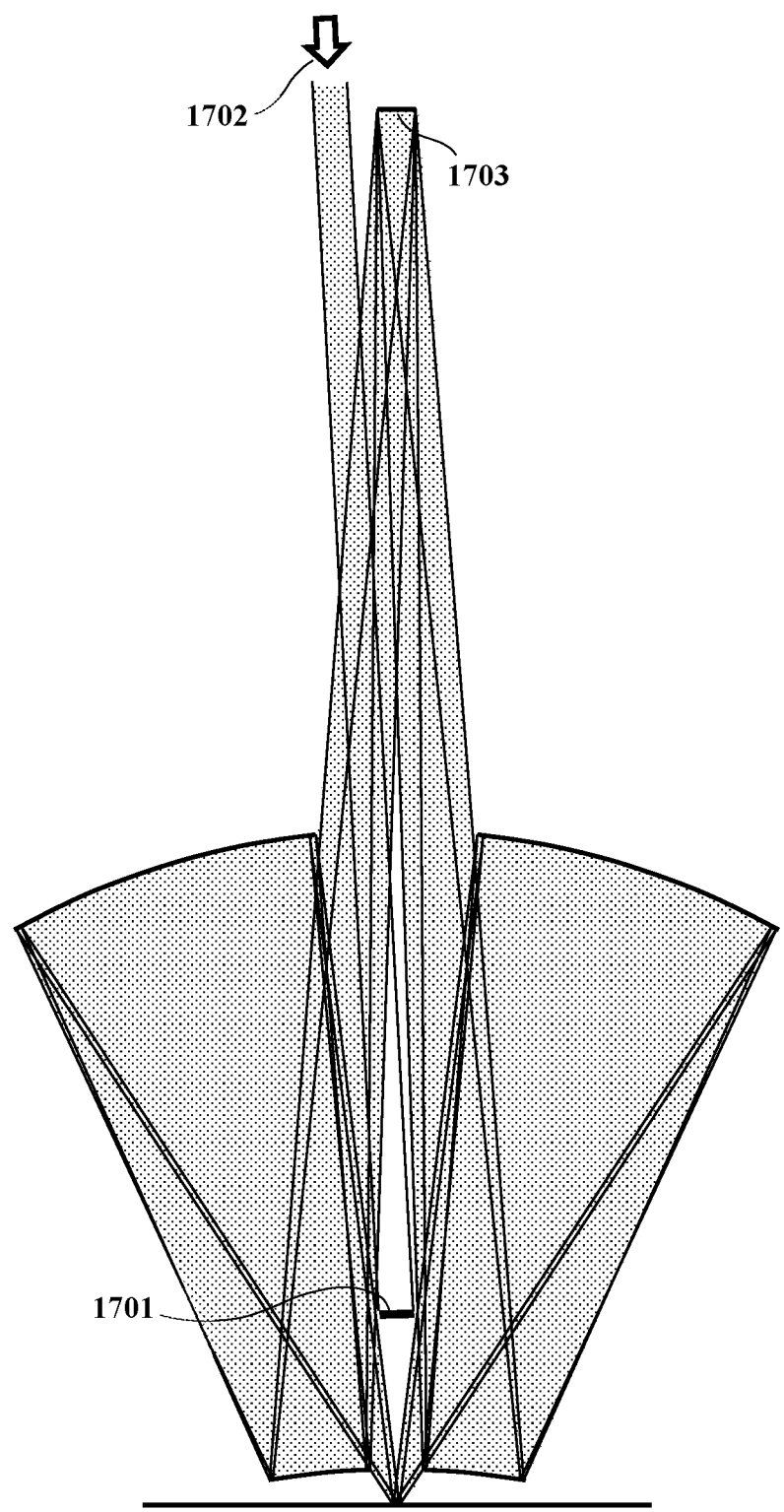
FIG. 17 illustrates EUV projection optics including a mirror that directs illumination onto a reflective holographic mask.

As illustrated in FIG. 17, the zero-order stop can alternatively be replaced with a small mirror 1701, which directs illumination 1702 onto a reflective holographic mask 1703 (rather than a transmission mask). The mirror 1701 performs a dual function of providing illumination to the mask and operating as a zero-order stop. The holographic mask is illuminated at near-normal incidence, so it would exhibit minimal 3-D effects compared to conventional EUV masks, which are illuminated at oblique incidence.

Figure 18:
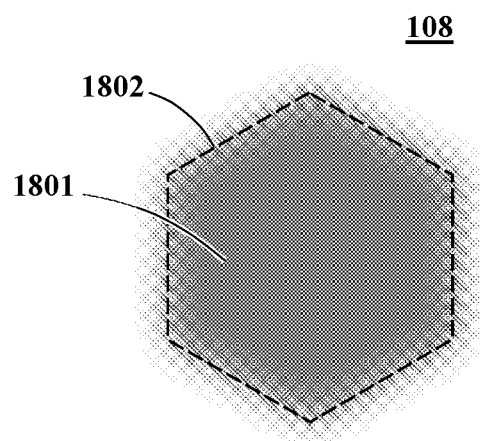
FIG. 18 illustrates a hexagonal illumination field on the writing surface.
Figure 19:
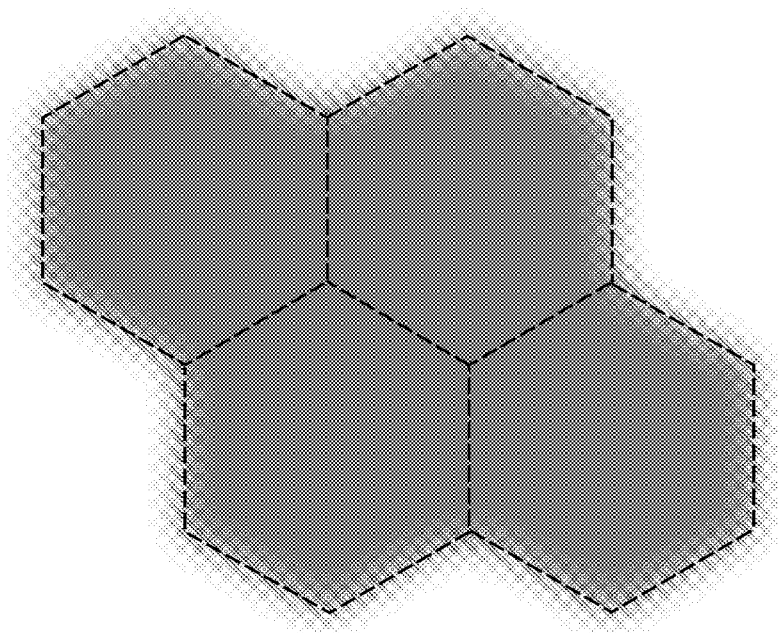
FIG. 19 illustrates multiple adjacent illumination fields on the writing surface.

A holographic mask, and the mask illumination optics, can be constructed to cover an image aperture with a shape such as a rectangle or hexagon that can be periodically tiled over the writing surface. For example, FIG. 18 illustrates a hexagonal illumination field 1801 (shaded area) on the writing surface 108. The illumination covers a hexagonal aperture 1802 whose perimeter defines "stitch lines" for pattern stepping, and the illumination can be apodized (tapered) across the stitch lines to avoid edge diffraction effects. Successive exposures are made with the writing surface stepped so that the stitch lines of adjacent illumination fields are aligned and apodized edges are overlapped, as illustrated in FIG. 19. FIG. 20 illustrates a holographic mask 2001, in plan view, which has multiple exposure patterns such as pattern 2002. The pattern images can be stitched via field stepping to seamlessly cover and extended print area, and multiple masks can be used to cover an even larger contiguous print area.

Mathematical Description of Optical Systems

An engineering specification of the above-described lithography systems requires a mathematical framework based on a physical optics foundation, as outlined below. Numbered equations are tabulated in FIG. 21.

The propagation of electromagnetic radiation through an optical system is generally modeled using a combination of near-field diffraction modeling and geometric optics. Near-field modeling applies to electromagnetic interaction with matter on wavelength-scale or smaller dimensions, e.g. within a multilayer reflection coating or in a diffraction grating, and requires accurate electromagnetic simulation, e.g. via Rigorous Coupled-Wave Diffraction theory (RCWA, Ref. 14). Geometric optics applies to propagation of optical waves through homogeneous media (e.g. vacuum) over distances much longer than the wavelength.

In the context of geometric optics a monochromatic electromagnetic field is characterized by "geometric waves", loci of constant optical phase, which propagate according the laws of geometric optics. The optical phase, measured in cycle units (aka "waves"; 1 cycle=$2\pi$ radian), is denoted as p. The phase gradient $\nabla p$ has magnitude $1/\lambda$ in vacuum (Eq. 21.1), where $\lambda$ is the wavelength. This is the "Eikonal equation" upon which geometric optics is based. Optical rays are straight lines orthogonal to the geometric waves (i.e., parallel to $\nabla p$), and p varies by one phase cycle per wave along an optical ray. The ray direction at any particular point on the ray is defined by a direction vector $\hat{u}$, comprising direction-cosine coordinates, which is the phase gradient times the wavelength, Eq. 21.2. The Eikonal equation implies that $\hat{u}$ is a unit vector, Eq. 21.3.

The total electromagnetic field in a region of space (e.g. within a lithography system's projection optics) can comprise a multiplicity of overlapping geometric-optic fields. The multiplicity can be an infinite continuum, i.e. an integral superposition of geometric-optic fields. The total field can typically be represented equivalently with alternative continuum descriptions, e.g. as a superposition of plane waves or as a superposition of point-convergent, spherical waves associated with image points.

Figure 22:
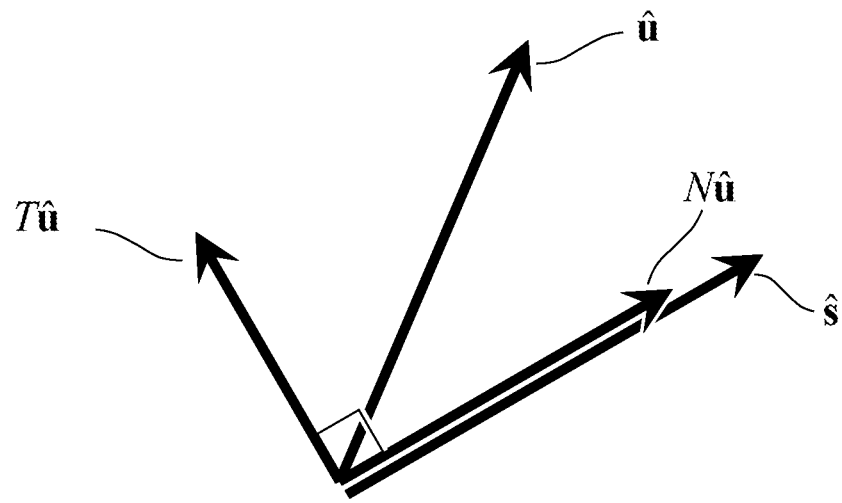
FIG. 22 illustrates an optical ray's direction vector and the vector's surface-tangential and surface-normal projections relative to an optical surface.

It follows from the Eikonal equation that a geometric-optics field's complete three-dimensional phase distribution can be constructed from its phase on a particular surface traversed by the field, by the following procedure: Given a specification of p on the surface, the surface-tangential projection of its gradient $\nabla p$ is determined, and the surface-tangential projection of the ray direction vector $\hat{u}$, denoted as $T\hat{u}$, is determined from Eq. 21.2. The vector's surface-normal component, denoted as $N\hat{u}$, is determined from the conditions that $N\hat{u}$ is orthogonal to the surface and $|\hat{u}|$ is equal to 1. (The sign of $N\hat{u}$ is undetermined by these conditions, but is defined based on which side of the surface the field is propagating into.) The relationships between $\hat{u}$, $T\hat{u}$, and $N\hat{u}$ are described in Eq's. 21.4 and illustrated in FIG. 22, in which $\hat{s}$ denotes the surface-normal unit vector at any particular surface point. Once $T\hat{u}$ and $N\hat{u}$ are known at the point, the optical ray direction vector $\hat{u}$ at that point is determined and the phase along the ray is determined by the condition that the phase varies by one cycle per wave along the ray.

The geometric theory of reflection at an optical surface is generally derived assuming a planar mirror and plane-wave illumination, but is applicable to curved mirrors and waves if the curvature is not significant over wavelength-scale dimensions. For reflection at a bare, uncoated mirror surface, the phase of a reflected beam is determined by the conditions that its phase is equal to that of the incident beam on the reflecting surface (except for a constant phase shift), implying that $T\hat{u}$ is unchanged by reflection, and $\hat{s} \cdot \hat{u}$ changes sign upon reflection.

Figure 23:
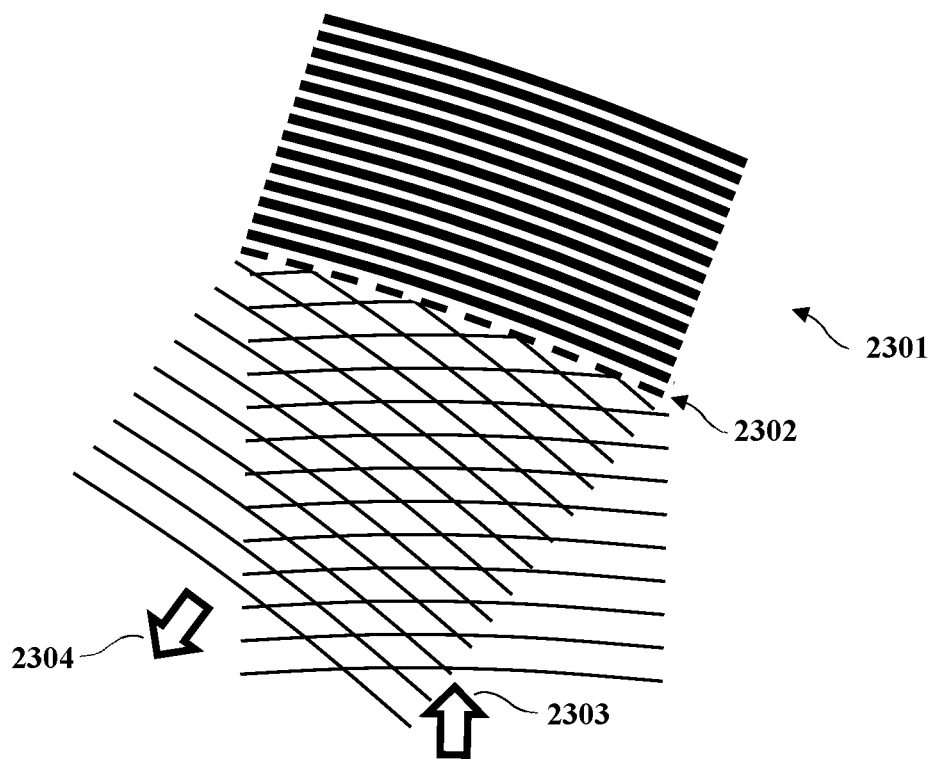
FIG. 23 illustrates a multilayer reflection mirror in cross-section, in relation to a reference reflection surface used for ray tracing.

Optical ray trace programs typically model mirrors as infinitesimally thin reflective surfaces, but in the case of EUV the reflection does not occur at a discrete surface; the reflection is distributed through a multilayer film many wavelengths thick. Nevertheless, the mirror can be modeled as a discrete surface by the following procedure. FIG. 23 illustrates a cross-sectional view of the multilayer reflective film 2301. A reference reflection surface 2302 near or within the film is defined; the incident field 2303 (depicted schematically as a wave train) is defined, and an accurate near-field electromagnetic calculation is performed to calculate the local reflected field 2304 in the vicinity of each point on the reference surface. (This calculation can be done using flat-surface and plane-wave approximations.) The incident and reflected fields outside of the mirror coating are analytically extrapolated to the reference surface 2302, and their phase difference on the surface is calculated. Standard ray tracing procedures can be applied, using reference surface 2302 as the effective mirror surface, but with the calculated phase offset applied to the reflected field.

Diffractive lenses and mirrors can similarly be modeled using a combination of near-field and geometric-optic calculation methods. Accurate near-field diffraction models such as RCWA assume a flat grating with periodic phase zones and plane-wave illumination, but approximations based on these conditions can be used to calculate local diffraction characteristics of diffractive lenses and mirrors with non-flat substrates, aperiodic phase zones, and non-planar waves.

Geometric ray tracing methods typically represent a diffractive element as an infinitesimally thin surface characterized by a "grating phase" gp, a continuous function of position on the surface, which varies by one unit per phase zone. (The zone boundaries can be defined as the loci on which gp takes on integer values.) A geometric-optics incident field will generally be diffracted into multiple diffraction orders, and the optical phase $p'_m$ of the m-th diffraction order on the surface (m= . . . ,−1,0,1, . . . ) will differ from the incident field phase $p_0$ by m times gp, Eq. 21.5. Based on this condition and Eq. 21.2, the incident and diffracted ray direction vectors, denoted as $\hat{u}_0$ and $\hat{u}'_m$, have surface-tangential projections $T\hat{u}_0$ and $T\hat{u}'_m$, which are related to the surface-tangential grating phase gradient $T\nabla gp$ by Eq. 21.6. The surface-normal projections are determined from the surface-tangential projections as described above (Eq's. 21.4 and FIG. 22).

As in the case of a multilayer mirror, a diffractive structure with significant depth, such as a zone-plate lens or IBF-processed mirror, can be modeled in ray trace calculations as an infinitesimally thin diffracting element, which induces a small additional phase shift to account for 3-D near-field diffraction effects within the structure. A near-field simulation method such as RCWA can be used to calculate the corrective phase shift.

Illustrative Optical Design for the Projection System

Figures 25, 26:
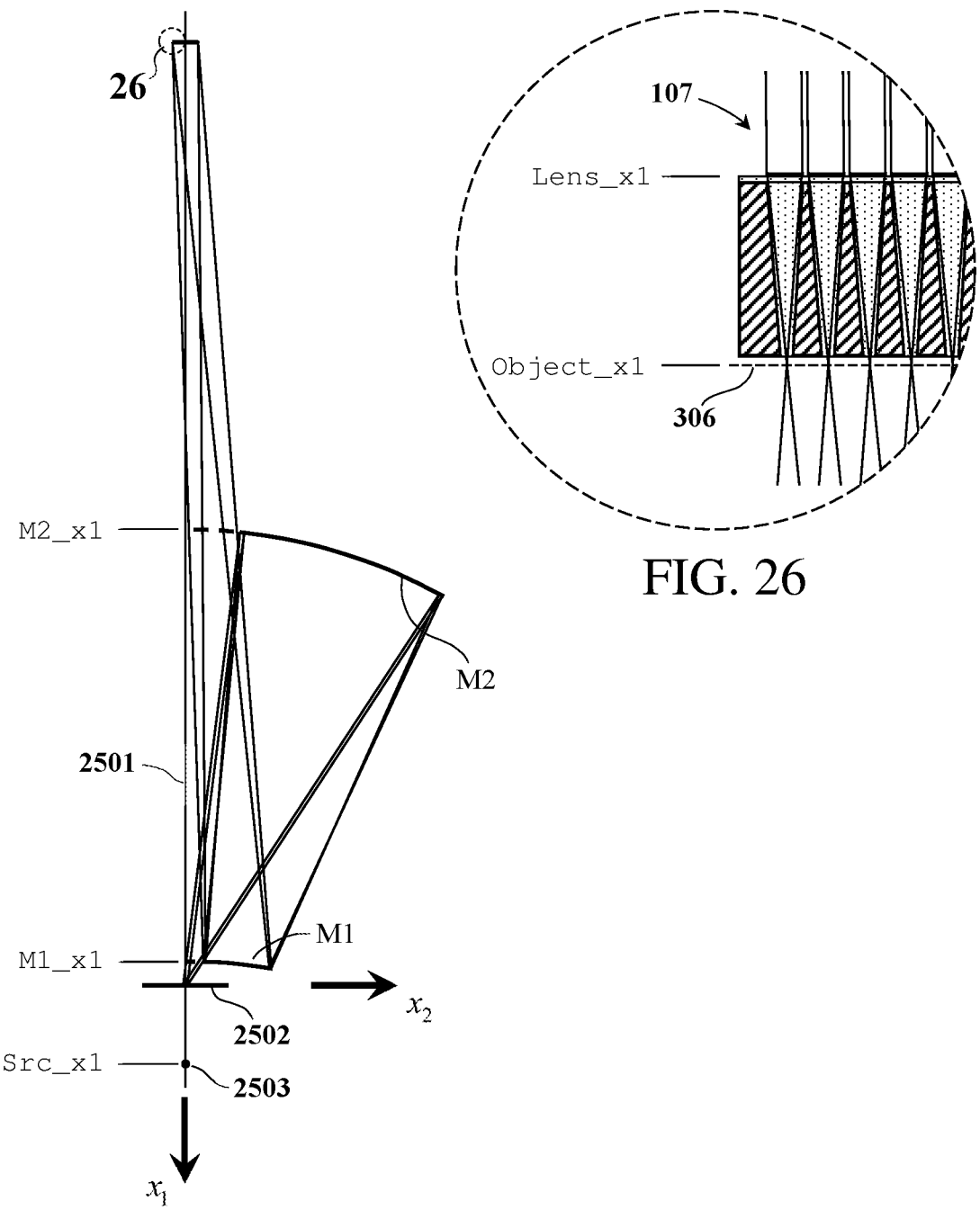
FIGS. 25 and 26 illustrate the optical geometry and coordinate system for FIG. 24.

FIG. 24 tabulates illustrative design data for a Schwarzschild projection system similar to FIG. 1. FIG. 25 illustrates the mirror geometry, which is referenced to $(x_1, x_2, x_3)$ Cartesian coordinates and is axially symmetric around an optical axis 2501 coinciding with the $x_1$ axis. The coordinate origin is at the image plane 2502 and $x_1$ is downward-positive (in the object-to-image direction). The illumination optics (not shown) focus EUV illumination toward a source focal point 2503 on the optical axis at coordinate location $x_1$=Src_x1 below the image plane. (For the purpose of design specification, the source is treated as a single point at the IF in FIG. 1, which is imaged by the illumination optics to point 2503.) A portion of FIG. 25 is expanded in FIG. 26 (similar to FIG. 3), showing the relationship between the microlens array 107 plane (or holographic mask plane), at coordinate location $x_1$=Lens_x1, and the projection system's object plane 306 at $x_1$=Object_x1. The mirror M1 and M2 shape functions intercept the axis 2501 at $x_1$=M1_x1 and $x_1$=M2_x1, respectively. Each mirror shape is defined by a "superconic" function of the form defined in Eq. 21.7 in FIG. 21, in which M_x1 is either M1_x1 or M2_x1 and the coefficients $c_1, c_2, \ldots$ have the values tabulated in FIG. 24 for each mirror. The M2 grating phase gp has the function form defined in Eq. 21.8, with coefficients $pc_1$ and $pc_2$ also tabulated in FIG. 24.

The microlenses' grating phase functions are defined to achieve zero-aberration imaging of the source center point at the image plane, and at the 13.5-nm design wavelength. This can be achieved by applying a phase-matching process: Rays from an image point corresponding to any particular lens are reverse-traced from the point back through the projection optics and onto the lens. The ray-trace procedure defines the transmitted optical phase at each ray intercept on the lens (at wavelength 13.5 nm), and the point-convergent source field's incident optical phase at the same intercept point is subtracted from the transmitted phase to define the grating phase at that point. This construction follows from Eq. 21.5 in FIG. 25, with $p_0$ representing the incident beam's phase, $p'_m$ representing the transmitted beam's phase in diffraction order m (typically m=1), and with gp representing the lens's grating phase. The surface-tangential gradient of the grating phase, $T\nabla gp$, is determined from Eq. 21.6. Once gp and $T\nabla gp$ are determined, Eq's. 21.5 and 21.6 can then be used to perform geometric ray tracing for other wavelengths and source points.

In developing the above-outlined design, the diffractive and reflective surfaces were approximated as infinitesimally thin layers. In practice, small surface phase offsets would need to be applied, as described in the preceding section, to account for the 3-D depth of the diffractive and reflective structures.

The design data in FIG. 24 was determined through an optical optimization procedure, using a merit function of the form defined by Eq. 1 in Ref. 2. The design numerical aperture (NA) is 0.55 (the same as ASML's EXE-5000 system), but the optimization was done using an oversized NA of 0.61 to preserve circularity of the microlens apertures and to avoid steep gradients in the grating phase at the lens periphery. The inner (obscuration) numerical aperture, NA_inner, is 0.125, implying a 5% aerial obscuration ratio: $(0.125/0.55)^2$=0.052. The demagnification factor, demag, is 6.

The calculated optical phase aberration of the projection system at the edge of the image field (where the aberration is highest) is 1-wave RMS (root-mean-square) and 4-wave P-V (peak-valley) at wavelength 13.5 nm, without correction by the microlenses. With the correction, the worst-case phase error is reduced to 0.01-wave RMS and 0.05-wave P-V over the wavelength range 13.35-13.65 nm and across a circular image field of diameter 7.8 nm defined by the source's geometric image on the writing surface. (The 7.8-nm source image size is based on Ref. 2.)

Illustrative Holographic Mask Structure

Figure 27:
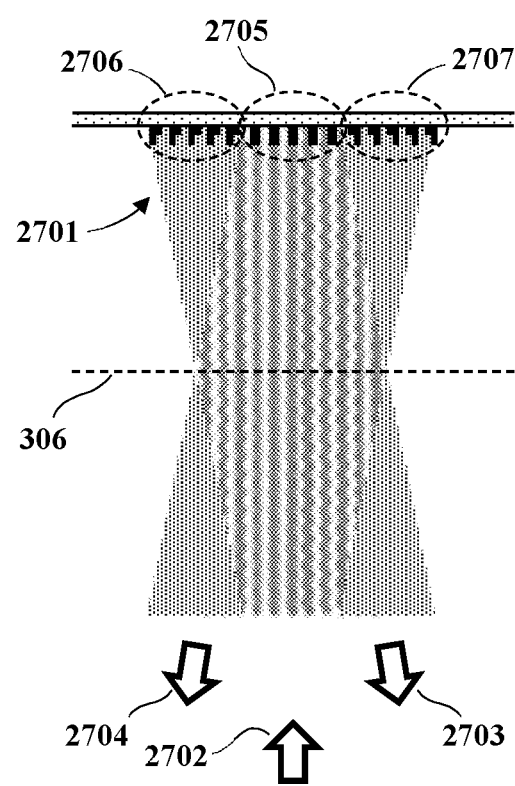
FIGS. 27-29 illustrate a possible design configuration for part of a reflective holographic mask.

FIG. 27 shows a cross-sectional schematic of a reflective holographic mask 2701, which is functionally similar to portion 1204 of the transmission mask 1201 illustrated in FIG. 12A. A diffractive structure on the mask reflects incident illumination 2702 into two diffracted beams 2703 and 2704 (+1 and −1 diffraction orders), which intersect to form a line/space interference pattern at the object plane 306. (The pattern can be pre-distorted and aberrated to correct the projection system's distortion and aberrations.) The central portion 2705 of the structure operates as a beam splitter, dividing the reflected radiation into two diffracted beams. Each outer portion 2706 and 2707 only generates one diffraction order. (However, all three portions can reflect some of the radiation into an undiffracted zero order, which is blocked by the mirror 1701 in FIG. 17, and they can also divert some radiation into high diffraction orders outside of the projection system's angular acceptance range.)

Figure 28:
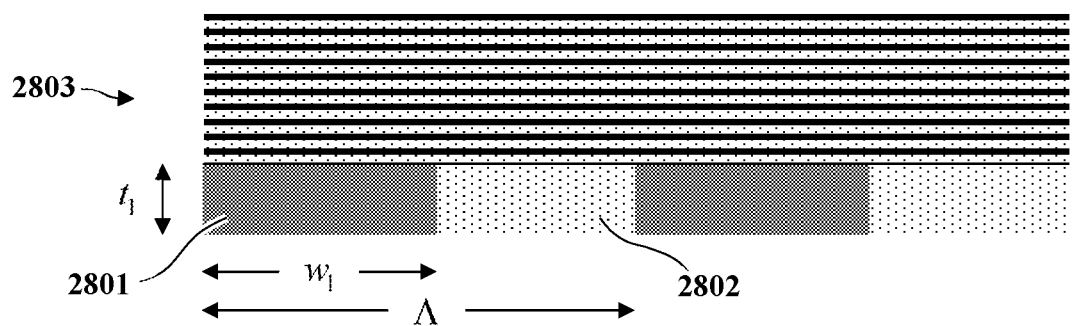

FIG. 28 shows a possible structure for the center beam-splitting portion 2705, in a cross-sectional view. The structure comprises ruthenium (Ru) grating lines such as line 2801 (shown in cross-section) and Si-filled spaces such as space 2802 formed on a Mo/Si multilayer reflective coating 2803. (There would typically be 40 or more Mo/Si bilayers.) Illustrative dimensions are $t_1$=33.0 nm for the line thickness, $w_1$=108.6 nm for the Ru linewidth, and Λ=200 nm for the grating period. (There would typically be many more periods than the two illustrated.) Normally incident EUV illumination at wavelength 13.5 nm is reflected into +1 and −1 diffraction orders (2703 and 2704 in FIG. 27), each with 18.7% diffraction efficiency. About 1.7% of the incident power is reflected into the zero order, which is blocked in the projection optics (by mirror 1701 in FIG. 17). Other diffraction orders are outside of the projection system's angular acceptance range. The grating period, 200 nm, will result in an interference pattern with a 100-nm period on the object plane, which is imaged by the projection optics, e.g. at 6× reduction, to a periodic line/space pattern with 16.7-nm period on the writing surface.

Figure 29:
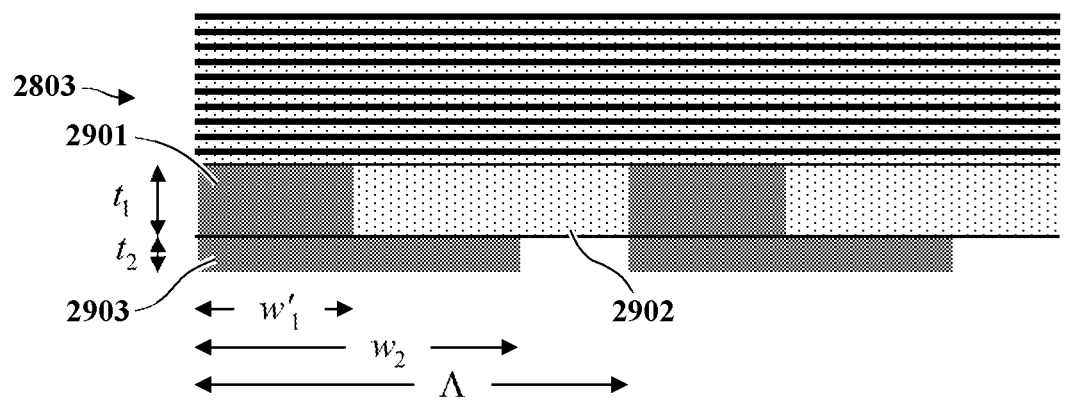

The side portion of the pattern, 2706 in FIG. 27, could have the structure illustrated in FIG. 29. This structure also comprises Ru grating lines such as line 2901 and Si-filled spaces such as space 2902 formed on the same Mo/Si reflective coating 2803, and with the same 33-nm thickness ($t_1$) and 200-nm period (Λ) as the center portion, but with a narrower Ru line width ($w'_1$=73.3 nm in FIG. 29 versus $w_1$=108.6 nm in FIG. 28). In addition, a second Ru layer 2903 of thickness $t_2$=16.2 nm is deposited on the structure and is patterned to form a grating with the same 200-nm period and with linewidth $w_2$=148.5 nm. (There is no Si fill in this grating's spaces. The top and bottom Ru grating lines' left edges are aligned.) This structure diffracts 18.7% of the illumination power into the +1 diffraction order 2703 in FIG. 27 (matching the efficiency of the FIG. 28 structure) and has substantially zero power in the −1 order 2704. (Much of the remaining power is shunted to the zero order, which has efficiency 9.2%.) The lateral displacement between the FIG. 28 and FIG. 29 structures is determined to achieve phase matching in the +1 diffraction order. Side portion 2707 in FIG. 27 can have a structure similar to FIG. 29, but configured to concentrate the reflected radiation in the −1 order rather than the +1 order.

Mask designs such as FIGS. 28 and 29 can be developed using near-field diffraction simulation tools such as RCWA, Ref. 14. Data on the optical characteristics (complex refractive index) of EUV materials can be obtained from the CXRO database, Ref. 15. More general holographic mask structures can comprise any number of layers with two or more line edges per period, or the structures can be topographically contoured (e.g. via grayscale lithography) rather than layered. They can also be aperiodic (e.g. for isolated image patterns), and three-dimensional structures such as checkerboard phase-shift gratings (similar to those described in Ref. 16) can be used to produce exposure patterns other than parallel lines and spaces.

REFERENCES

The following additional patent and literature references are referred to in this disclosure and are incorporated by reference:

| | | |
|---|---|---|
| U.S. Pat. No. 9,097,983 | issued August 2015 | Johnson |
| U.S. Pat. No. 7,499,149 | issued March 2009 | Hendriks et al. |
| U.S. Pat. No. 7,050,237 | issued May 2006 | Chapman |

Ref. 1: K. Johnson, "Maskless EUV Lithography", presented at the 2019 EUVL Workshop.
https://www.euvlitho.com/2019/P22.pdf Ref. 2: Kenneth C. Johnson, "Maskless EUV lithography, an alternative to e-beam," *J. Micro/Nanolith. MEMS MOEMS* 18(4), 043501 (2019)
https://doi.org/10.1117/1.JMM.18.4.043501

Ref. 3: Erdmann, Andreas, et al. "3D mask effects in high NA EUV imaging." *Extreme Ultraviolet (EUV) Lithography X*. Vol. 10957. International Society for Optics and Photonics, 2019.
https://doi.org/10.1117/12.2515678

Ref. 4: P. Naujok et al., "B-based ML coatings for Blue-X", presented at the 2019 EUV Source Workshop.
https://www.euvlitho.com/2019/S23.pdf Ref. 5: Salmassi, Farhad H., et al. "Fabrication and performance of transmission engineered molybdenum-rich phase structures in the EUV regime (Conference Presentation)." *International Conference on Extreme Ultraviolet Lithography* 2017. Vol. 10450. International Society for Optics and Photonics, 2017.
https://doi.org/10.1117/12.2281487

Ref. 6: Deuter, V., et al. "Holographic masks for computational proximity lithography with EUV radiation." *International Conference on Extreme Ultraviolet Lithography* 2018. Vol. 10809. International Society for Optics and Photonics, 2018.
https://doi.org/10.1117/12.2502879

Ref. 7: Cheng, Yang-Chun, et al. "Extreme ultraviolet holographic lithography: Initial results." *Applied Physics Letters* 90.2 (2007): 023116.
https://doi.org/10.1063/1.2430774

Ref. 8: Isoyan, A., et al. "Extreme ultraviolet holographic lithography with a table-top laser." *Alternative Lithographic Technologies*. Vol. 7271. International Society for Optics and Photonics, 2009.
https://doi.org/10.1117/12.814678

Ref. 9: Borisov, Michael V., et al. "Experimental verification of sub-wavelength holographic lithography physical concept for single exposure fabrication of complex structures on planar and nonplanar surfaces." 33rd European Mask and Lithography Conference. Vol. 10446. International Society for Optics and Photonics, 2017.
https://doi.org/10.1117/12.2279736

Ref. 10: Bass, Michael. *Handbook of Optics Volume II Devices, Measurements, and Properties*. McGraw-Hill, Inc., 1995. (p. 18.15)

Ref. 11: Tsuru, T., K. Arai, and T. Hatano. "Homogenized ion milling over the whole area of EUV spherical multilayer mirrors for reflection phase error correction." *Journal of Physics. Conference Series* (Online). Vol. 425. No. 15. 2013.
https://doi.org/10.1088/1742-6596/425/15/152009

Ref. 12: Voronov, D. L., et al. "Enhancement of diffraction efficiency via higher-order operation of a multilayer blazed grating." *Optics Letters* 39.11 (2014): 3157-3160.
https://doi.org/10.1364/OL.39.003157

Ref. 13: Päivänranta, Birgit, et al. "Sub-10 nm patterning using EUV interference lithography." *Nanotechnology* 22.37 (2011): 375302.
https://doi.org/10.1088/0957-4484/22/37/375302

Ref. 14: Kenneth C. Johnson (2019) Grating Diffraction Calculator (GD-Calc®) [Source Code].
https://doi.org/10.24433/CO.7479617.v3

Ref. 15: The Center for X-Ray Optics, Lawrence Berkeley National Laboratory, "CXRO X-Ray Interactions With Matter."
http://henke.lbl.gov/optical_constants/

Ref. 16: Naulleau, Patrick, et al. "Ultrahigh efficiency EUV contact-hole printing with chromeless phase shift mask." *Photomask Japan* 2016: *XXIII Symposium on Photomask and Next-Generation Lithography Mask Technology*. Vol. 9984. International Society for Optics and Photonics, 2016.
https://doi.org/10.1117/12.2243321

What is claimed is:

1. A maskless lithography scanner comprising an optical radiation source, illumination optics, a microlens array comprising a plurality of microlenses, projection optics comprising at least one diffractive mirror, a scanning mechanism, and a modulation mechanism, which operate cooperatively to form a lithographic exposure pattern on a writing surface, wherein:
   the illumination optics direct optical radiation from the radiation source onto the microlens array;
   the microlens array partitions the radiation into multiple optical beams;
   the microlens array and projection optics operate in combination to focus each optical beam to a discrete focus spot on the writing surface, substantially free of geometric and chromatic aberration, wherein the diffractive mirror substantially neutralizes the microlenses' chromatic effects; and
   the scanning mechanism raster-scans the writing surface, and the modulation mechanism simultaneously modulates the beam intensities, to record a synthesized, high-resolution raster image in the photosensitive layer.

2. The maskless lithography scanner of claim 1, wherein the microlenses are binary-optic, zone-plate elements.

3. The maskless lithography scanner of claim 2, wherein the radiation is EUV radiation including wavelength 13.5 nm and the binary-optic, zone-plate elements comprise a patterned molybdenum layer on a silicon substrate layer, which is supported by a microchannel plate containing hollow channels for beam transmission.

4. The maskless lithography scanner of claim 2, wherein the radiation is EUV radiation including wavelength 6.7 nm and the binary-optic, zone-plate elements comprise a patterned layer composed of lanthanum, or a lanthanum compound, on a boron carbide substrate layer, which is supported by a microchannel plate containing hollow channels for beam transmission.

5. The maskless lithography scanner of claim 1, wherein the projection optics comprise two mirrors in a finite-conjugate, flat-field Schwarzschild configuration.

6. The maskless lithography scanner of claim 1, wherein the diffractive mirror comprises a multilayer reflection film, which has been ion-milled to form a depression traversing the layers.

7. The maskless lithography scanner of claim 6, wherein the radiation is EUV radiation including wavelength 13.5 nm and the multilayer reflection film comprises alternating layers of molybdenum and silicon.

8. The maskless lithography scanner of claim 6, wherein the radiation is EUV radiation including wavelength 6.7 nm and the multilayer reflection film comprises alternating layers of lanthanum, or a lanthanum compound, and boron carbide.

9. The maskless lithography scanner of claim 1, wherein the modulation mechanism comprises micromechanical shutters and the beams are individually modulated by corresponding shutters.

10. The maskless lithography scanner of claim 1, wherein the modulation mechanism modulates the radiation at the source, whereby all of the beams are collectively modulated to expose a periodic image pattern on the writing surface.

11. A holographic lithography stepper comprising an optical radiation source, illumination optics, a holographic mask, and projection optics comprising at least one diffractive mirror, which operate cooperatively to form a lithographic exposure pattern a writing surface, wherein:
   the illumination optics direct optical radiation from the radiation source onto the mask;
   the mask modifies the radiation to form a diffracted beam; and
   the mask and projection optics operate in combination to direct the diffracted beam onto the writing surface and to form an optical exposure image on the writing surface, substantially free of geometric and chromatic aberration, wherein the diffractive mirror substantially neutralizes mask-induced chromatic aberration in the diffracted beam.

12. The holographic lithography stepper of claim 11, wherein the mask is a transmission mask.

13. The holographic lithography stepper of claim 12, wherein the radiation is EUV radiation including wavelength 13.5 nm and the mask comprises a molybdenum diffracting structure on a silicon substrate layer.

14. The holographic lithography stepper of claim 12, wherein the radiation is EUV radiation including wavelength 6.7 nm and the mask comprises a diffracting structure composed of lanthanum, or a lanthanum compound, on a boron carbide substrate layer.

15. The holographic lithography stepper of claim 11, wherein the mask is a reflection mask.

16. The holographic lithography stepper of claim 15, wherein the radiation is EUV radiation including wavelength 13.5 nm and the mask comprises a molybdenum diffracting structure on a multilayer reflection film comprising alternating layers of molybdenum and silicon.

17. The holographic lithography stepper of claim 15, wherein the radiation is EUV radiation including wavelength 6.7 nm and the mask comprises a diffracting structure composed of lanthanum, or a lanthanum compound, on a multilayer reflection film comprising alternating layers of lanthanum, or a lanthanum compound, and boron carbide.

18. The holographic lithography stepper of claim 15, wherein the illumination optics include a mirror that performs two functions of directing the optical radiation onto the reflection mask and blocking zero-order radiation in the diffracted beam.

19. The holographic lithography stepper of claim 11, wherein the projection optics comprise two mirrors in a finite-conjugate, flat-field Schwarzschild configuration.

20. The holographic lithography stepper of claim 11, wherein the projection optics include a zero-order stop for blocking zero-order radiation in the diffracted beam.

21. A holographic lithography system comprising two or more stepper modules of claim 11, wherein the modules share the same optical radiation source, and wherein the system further comprises a beam-switching mechanism for directing the source radiation alternately into any one of the stepper modules, whereby any one module can be performing a lithographic exposure operation while other modules are performing stepping and alignment operations.

22. The holographic lithography system of claim 21, wherein the beam-switching mechanism comprises one or more movable beam-deflection mirrors.

23. The holographic lithography system of claim 21, wherein the beam-switching mechanism comprises one or more movable beam-deflection diffraction gratings.

24. The holographic lithography system of claim 23, wherein the diffraction gratings are formed on a substrate surface, which rotates to effect beam switching.

25. The holographic lithography system of claim 24, wherein the substrate is a flat disk.

* * * * *